US011610820B2

(12) United States Patent
Ramkumar et al.

(10) Patent No.: US 11,610,820 B2
(45) Date of Patent: Mar. 21, 2023

(54) EMBEDDED SONOS AND HIGH VOLTAGE SELECT GATE WITH A HIGH-K METAL GATE AND MANUFACTURING METHODS OF THE SAME

(71) Applicant: Infineon Technologies LLC, San Jose, CA (US)

(72) Inventors: Krishnaswamy Ramkumar, San Jose, CA (US); Venkatraman Prabhakar, Pleasanton, CA (US)

(73) Assignee: Infineon Technologies LLC, San Jose, CA (US)

( * ) Notice: Subject to any disclaimer, the term of this patent is extended or adjusted under 35 U.S.C. 154(b) by 217 days.

(21) Appl. No.: 16/902,670

(22) Filed: Jun. 16, 2020

(65) Prior Publication Data

US 2020/0350213 A1 Nov. 5, 2020

Related U.S. Application Data

(60) Provisional application No. 62/992,795, filed on Mar. 20, 2020, provisional application No. 62/877,953, filed on Jul. 24, 2019.

(51) Int. Cl.
| | |
|---|---|
| *H01L 21/00* | (2006.01) |
| *H01L 21/8238* | (2006.01) |
| *H01L 27/11563* | (2017.01) |
| *H01L 27/092* | (2006.01) |
| *H01L 29/792* | (2006.01) |
| *H01L 29/66* | (2006.01) |
| *H01L 27/11568* | (2017.01) |
| *H01L 27/11573* | (2017.01) |

(52) U.S. Cl.
CPC ........... *H01L 21/823828* (2013.01); *H01L 21/823857* (2013.01); *H01L 27/0922* (2013.01); *H01L 27/11563* (2013.01); *H01L 27/11568* (2013.01); *H01L 27/11573* (2013.01); *H01L 29/66833* (2013.01); *H01L 29/792* (2013.01)

(58) Field of Classification Search
CPC ....... H01L 21/82328; H01L 21/823857; H01L 27/0922; H01L 27/11563; H01L 27/11568; H01L 27/11573; H01L 29/66833; H01L 29/792
See application file for complete search history.

(56) References Cited

U.S. PATENT DOCUMENTS

| | | | |
|---|---|---|---|
| 5,943,596 | A | 8/1999 | Gardner et al. |
| 8,883,624 | B1 | 11/2014 | Ramkumar |
| 2011/0062520 | A1 | 3/2011 | Brask et al. |
| 2019/0103414 | A1* | 4/2019 | Ramkumar ......... H01L 27/1157 |

OTHER PUBLICATIONS

International Search Report for International Application No. PCT/US2020/043113 dated Oct. 21, 2020; 3 pages.
Written Opinion of the International Searching Authority for International Application No. PCT/US2020/043113 dated Oct. 21, 2020; 8 pages.

* cited by examiner

*Primary Examiner* — Richard A Booth

(57) ABSTRACT

Semiconductor devices and methods of manufacturing the same are provided. The semiconductor devices may have a memory array having two transistor (2T) memory cells, each including a non-volatile memory (NVM) transistor and a high voltage (HV) field-effect transistor (FET) as a select transistor. The devices further include a logic area in which HV FETs, input/output (I/) FETs, and low voltage (LV)/core FETs are formed thereon. Other embodiments are also described.

22 Claims, 23 Drawing Sheets

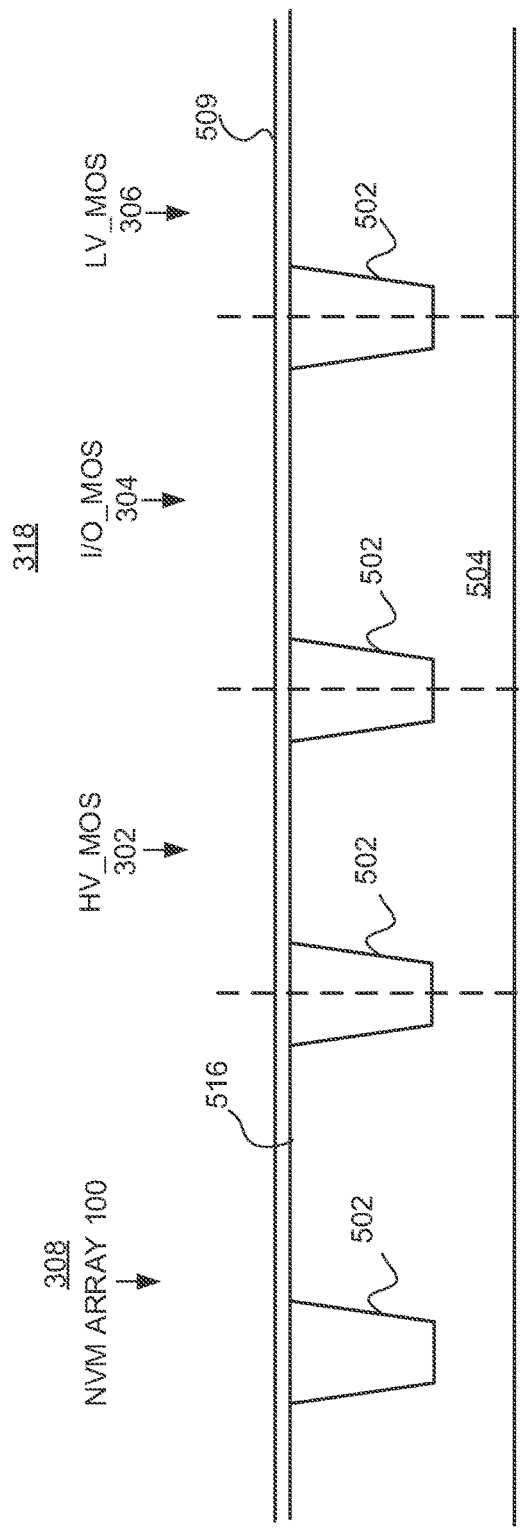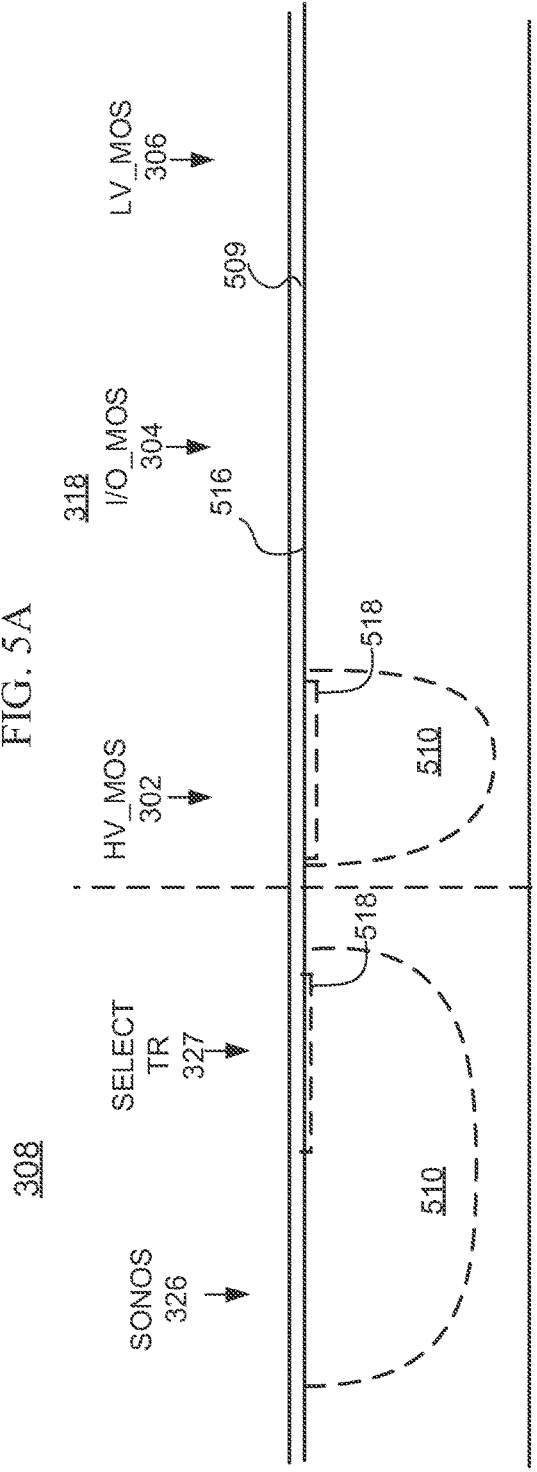

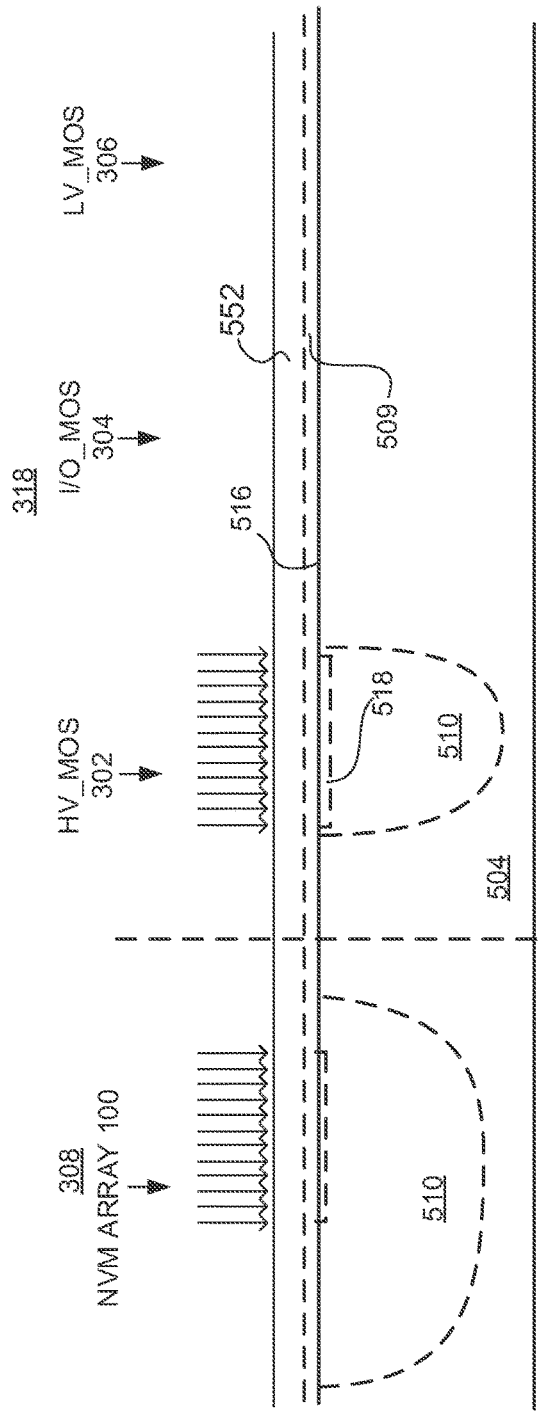
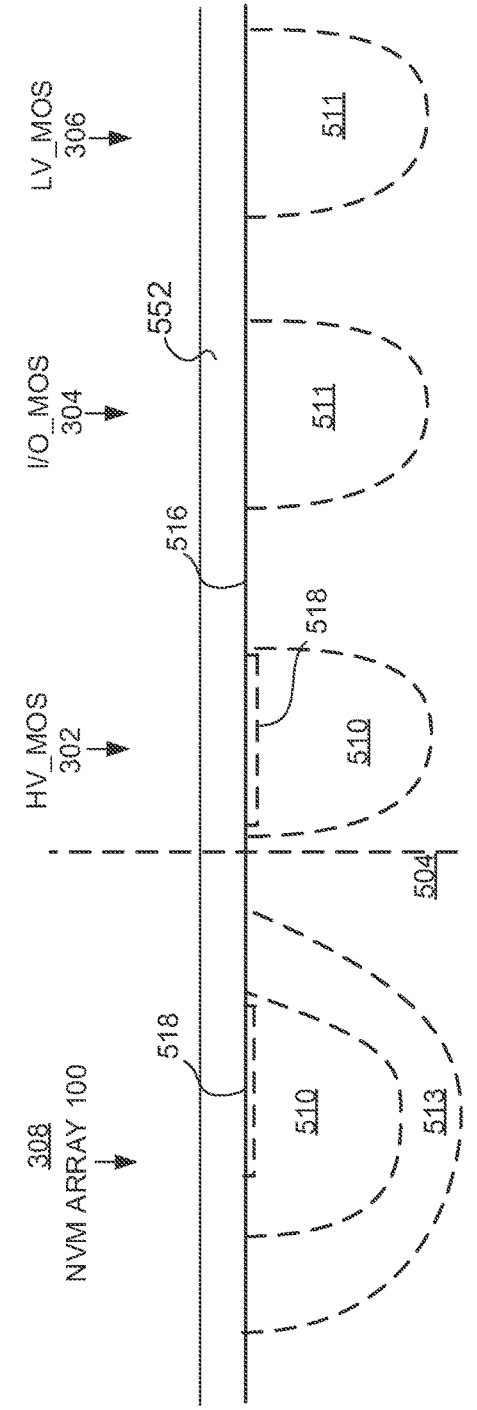

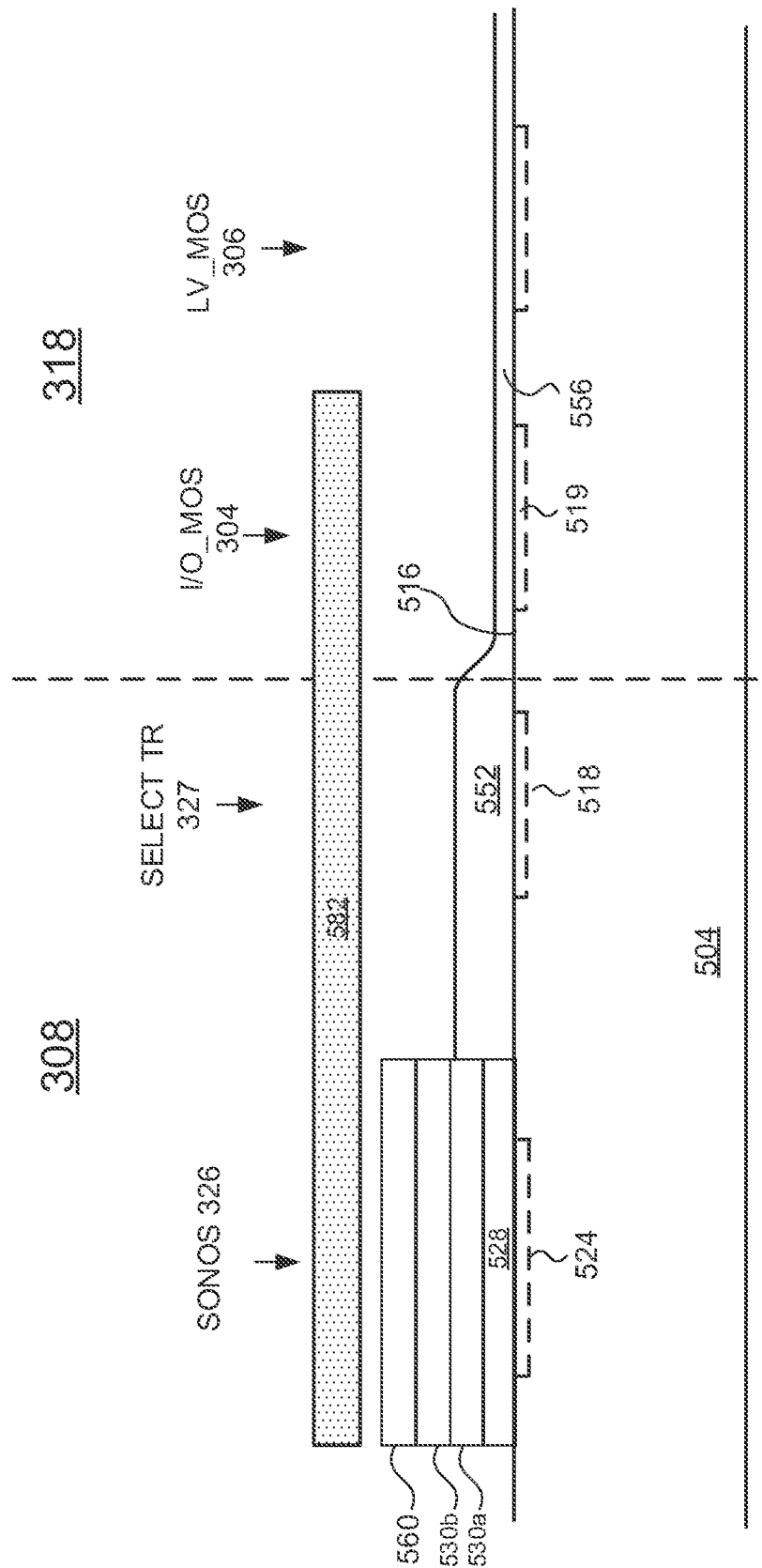

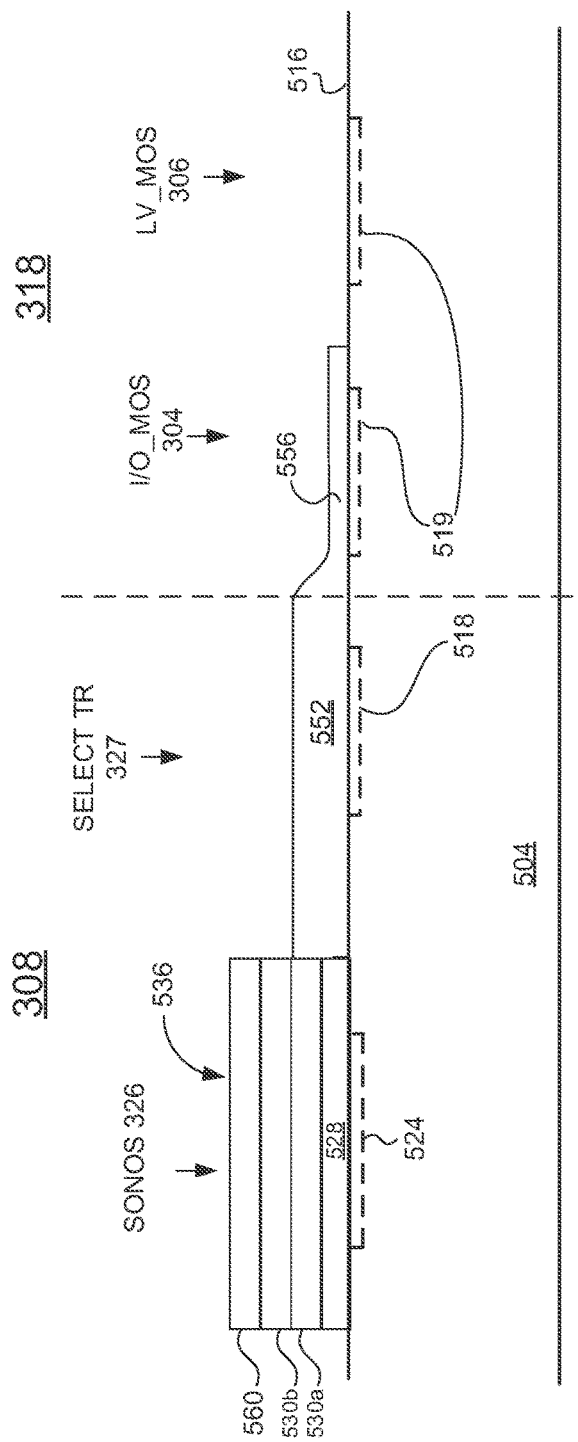
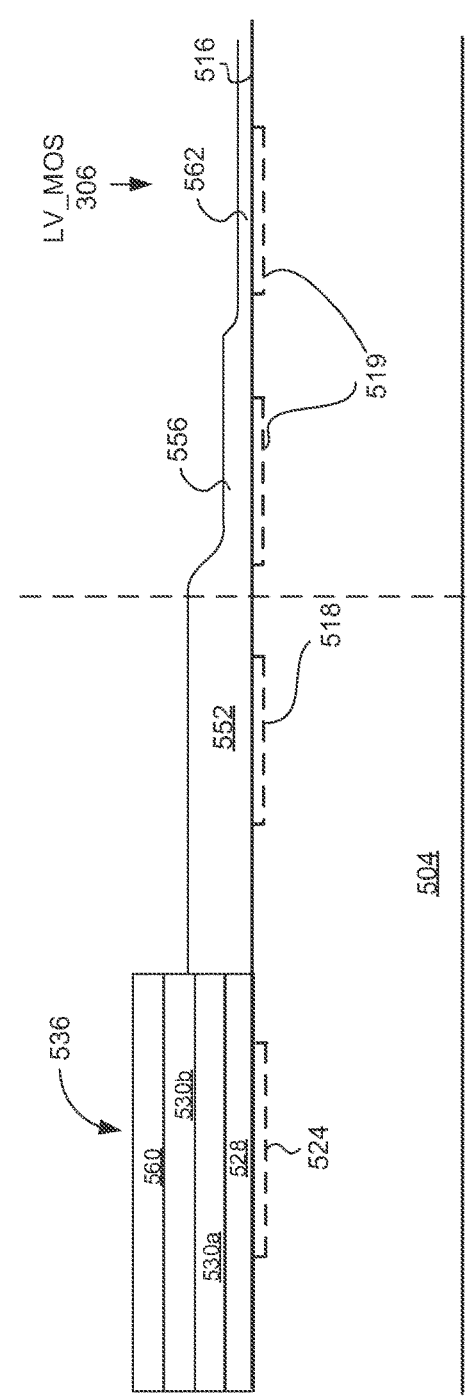
FIG. 5J
FIG. 5K

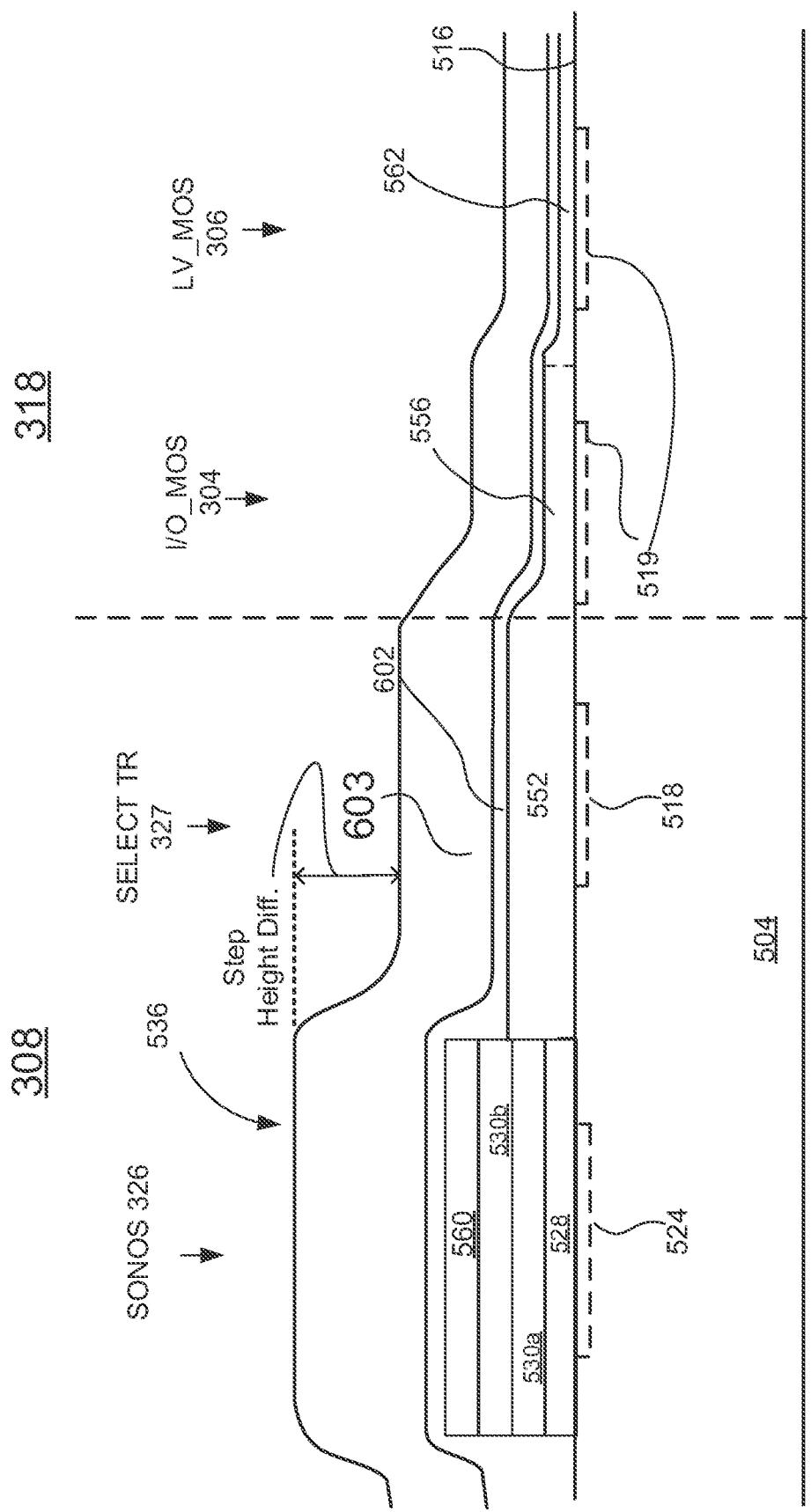

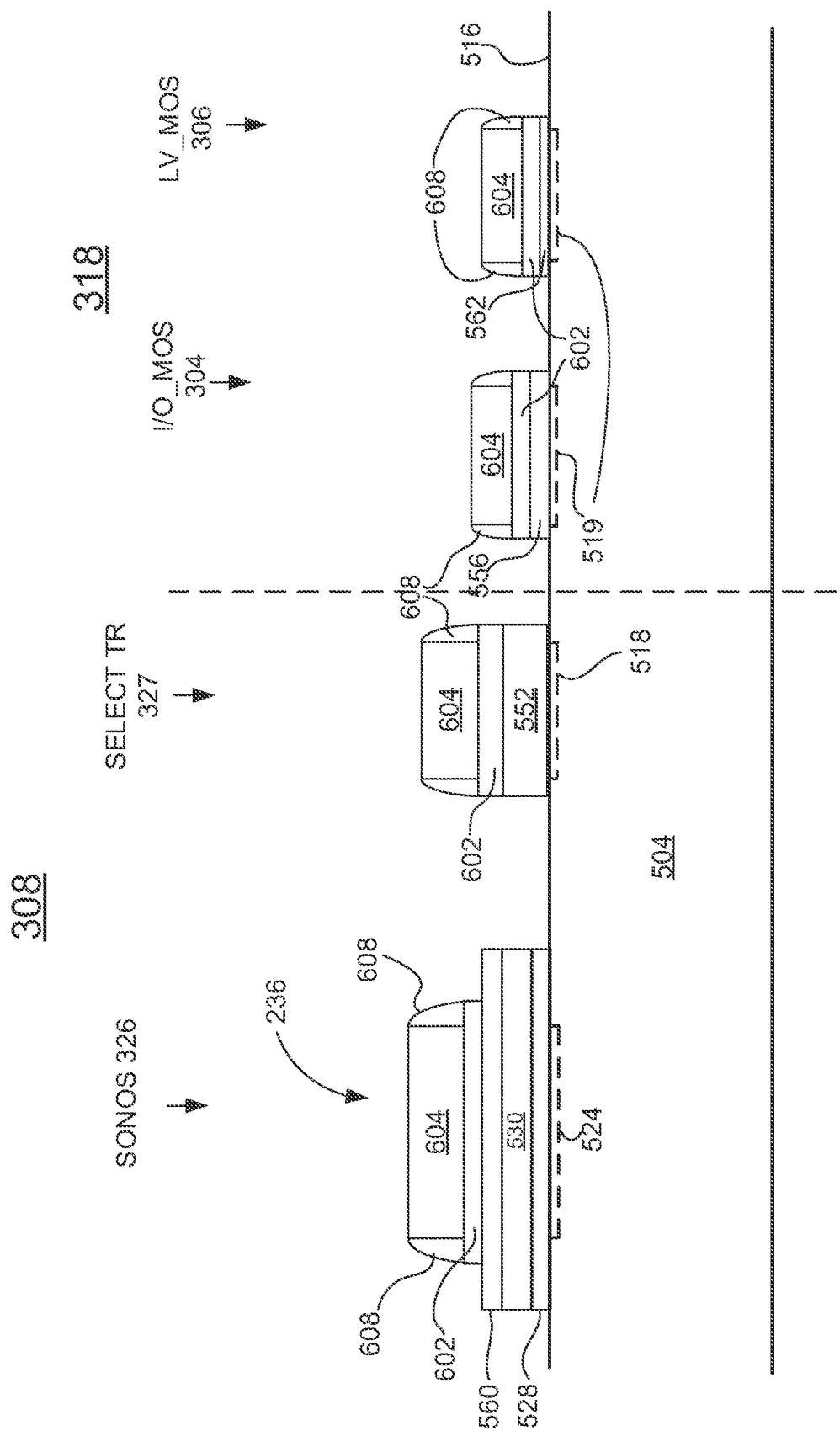

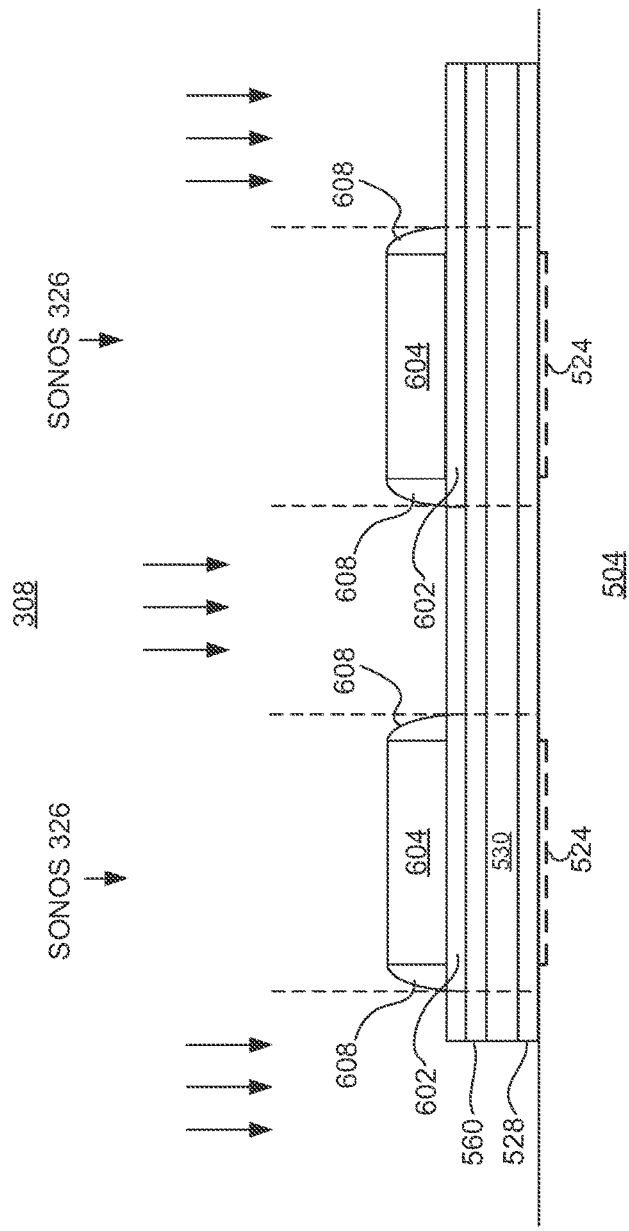
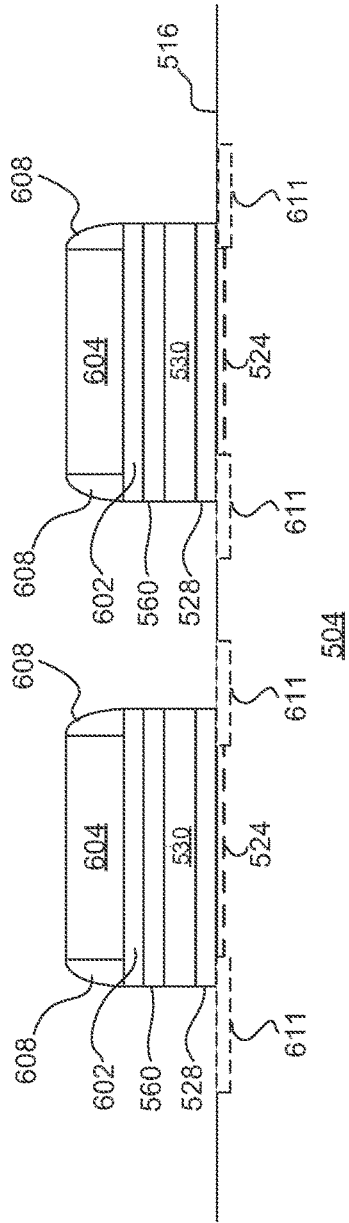

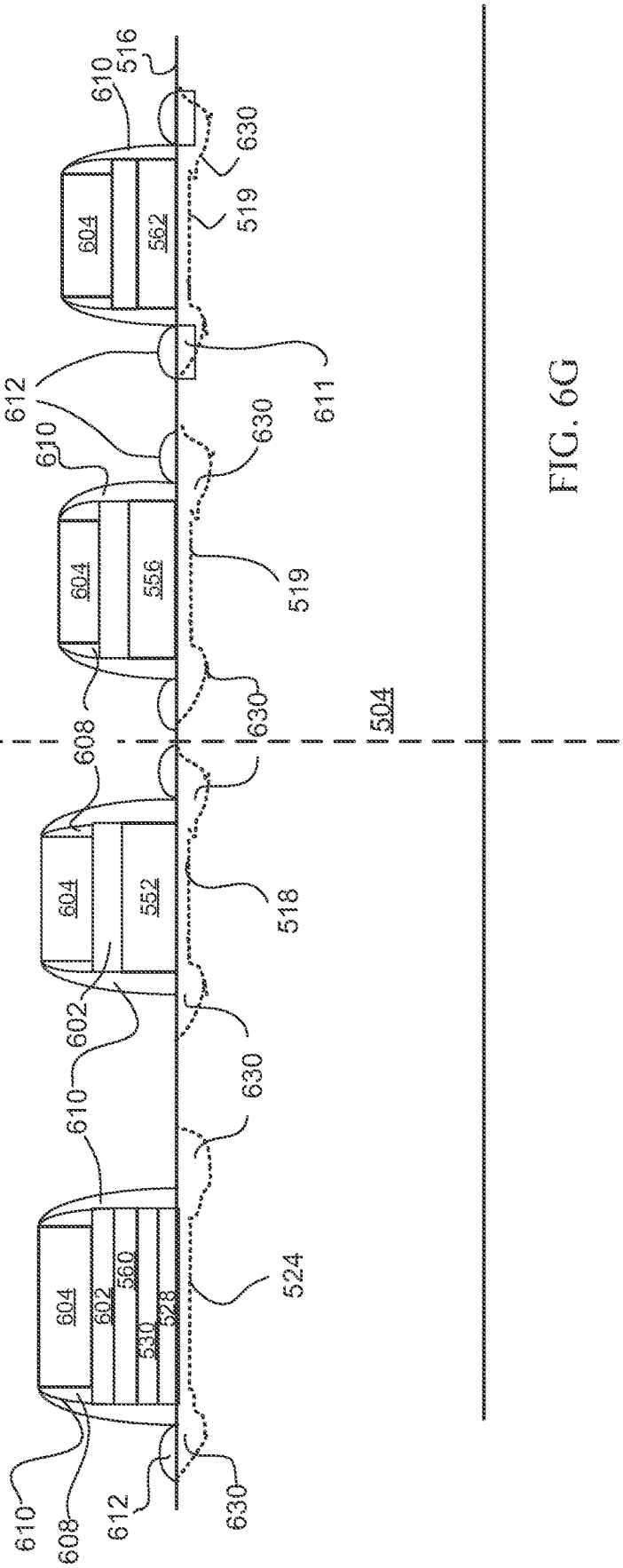

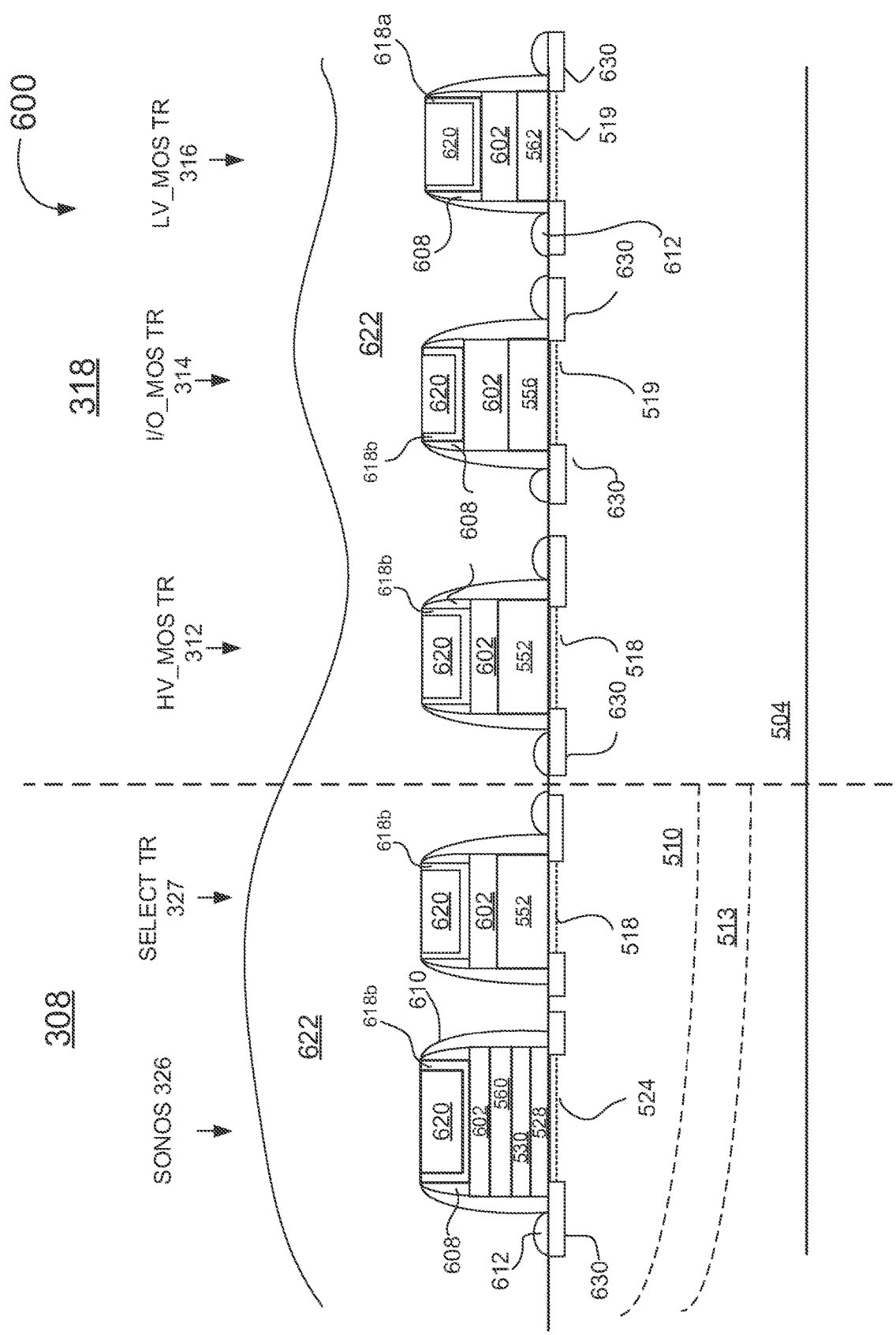

EMBEDDED SONOS AND HIGH VOLTAGE SELECT GATE WITH A HIGH-K METAL GATE AND MANUFACTURING METHODS OF THE SAME

PRIORITY

The present application claims the priority and benefit under 35 U.S.C. § 119(e) of U.S. Provisional Application No. 62/877,953, filed on Jul. 24, 2019 and U.S. Provisional Application No. 62/992,795, filed on Mar. 20, 2020, which are both incorporated by reference herein in each of its entirety.

TECHNICAL FIELD

The present disclosure relates generally to semiconductor devices, and more particularly to memory cells and methods of manufacturing thereof including an embedded or integrally formed charge-trapping gate stack and a high-voltage select gate stack having a high-K or hi-K dielectric (HK) and a metal gate (MG) into an existing complementary metal-oxide-semiconductor (CMOS) foundry logic technology.

BACKGROUND

For many system-on-chip integrated circuits (SOC ICs), such as micro-controllers, touch screen controllers in mobile devices or automobiles, and smart cards, etc., it may be essential to incorporate significant amount of non-volatile (NV) memory embedded for storing system firmware and data. It may be desirable to integrate logic devices and interface circuits based upon metal-oxide-semiconductor field-effect transistors (MOSFET or MOS) and non-volatile memory (NVM) transistors on a single integrated circuit package, a single chip or a single substrate. This integration, in some embodiments, may seriously impact both the MOS transistors and NVM transistors fabrication processes. MOS transistors are typically fabricated using a standard or baseline complementary-metal-oxide-semiconductor (CMOS) process flow, involving the formation and patterning of conducting, semiconducting and dielectric materials. The composition of these materials, as well as the composition and concentration of processing reagents, and temperature used in such a CMOS process flow are stringently controlled for each operation to ensure the resultant MOS transistors will function properly.

Non-volatile memory devices include NVM transistors, such as silicon-oxide-nitride-oxide-silicon or semiconductor-oxide-nitride-oxide-semiconductor (SONOS) based transistors, including charge-trapping gate stacks in which a stored or trapped charge changes a threshold voltage of the NVM transistor to store information as a logic "1" or "0". Charge-trapping gate stack formation may involve the formation of a nitride or oxynitride charge-trapping layer(s) disposed between two dielectric or oxide layers. Charge-trapping gate stack is typically fabricated using materials and processes that differ significantly from those of the baseline CMOS process flow, and which may detrimentally impact or be impacted by the fabrication of the MOS transistors. In particular, forming a gate oxide or dielectric of a MOS transistor may significantly degrade performance of a previously formed charge-trapping gate stack by altering a thickness or composition of the charge-trapping layer(s). In addition, this integration may also impact the baseline CMOS process flow, and generally require a substantial number of mask sets and process steps, which add to the expense of fabricating the devices and may reduce yield of working devices.

Besides, it may be important for the integrated fabrication process to be able to control the thickness of top or blocking dielectric of NVM transistors, for example, in order to meet requirements such as desirable threshold voltages Vts and/or equivalent oxide thickness (EOT) while satisfying gate oxide thickness (physical or electrical) targets of MOS transistors, especially if those MOS transistors are high voltage (HV) or input/output (I/O) transistors.

As technology nodes are getting smaller, for example at 28 nm and below, high-K metal gate (HKMG) stacks have become more important. HKMG stacks may switch using a thin high-K dielectric additionally or alternatively to the blocking silicon dioxide or silicon oxynitride layer and a metal gate instead of a polysilicon gate. Among other benefits, HKMG stacks may reduce leakage and improve overall performance of MOS transistors, and data retention of SONOS transistors. Therefore, there are needs to incorporate SONOS into HKMG CMOS process flow. The introduction of metal gates to SONOS transistors may transform the device to metal-oxide-nitride-oxide-semiconductor (MONOS). It will be the understanding that the two terms, viz. SONOS and MONOS are used interchangeably throughout this patent document.

BRIEF DESCRIPTION OF THE DRAWINGS

The present disclosure is illustrated by way of example, and not by way of limitation, in the FIGS. of the accompanying drawings.

FIGS. 5A-5L are representative diagrams illustrating cross-sectional views of a portion of a 2T memory cell and CMOS devices during fabrication according to the process flow in FIG. 4A; and FIGS. 6A-6J are representative diagrams illustrating cross-sectional views of a portion of a 2T memory cell and CMOS devices during fabrication according to the process flow in FIG. 4B; and FIG. 6K is a representative block diagram illustrating one embodiment of embedded SONOS or MONOS based NVM device 600, as fabricated in FIGS. 5A-5L and 6A-6J.

DETAILED DESCRIPTION

Figure 1A:
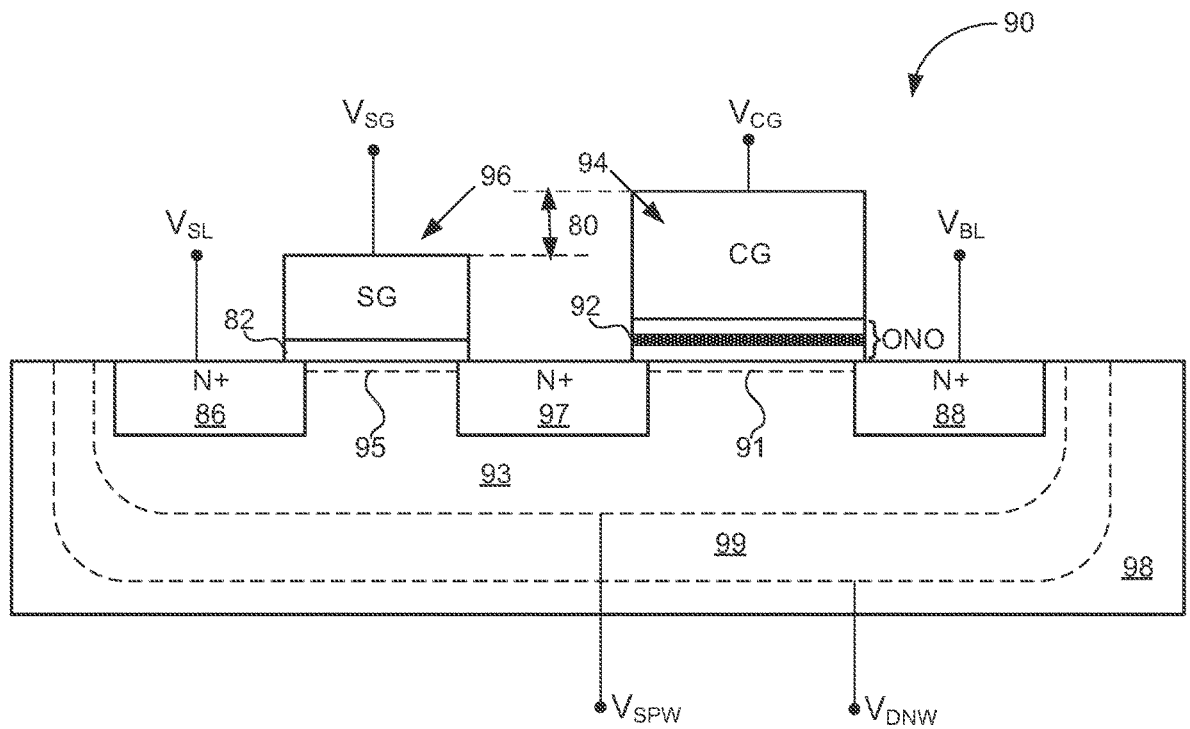
FIG. 1A is a block diagram illustrating a cross-sectional side view of a SONOS based non-volatile memory transistor or device.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Embodiments of a 2T memory cell including an embedded non-volatile memory (NVM) transistor and high voltage (HV) metal-oxide-semiconductor (MOS) transistors having a high-K metal gate (HKMG) stack, and methods of fabricating the same are described herein with reference to figures. However, particular embodiments may be practiced without one or more of these specific details, or in combination with other known methods, materials, and apparatuses in related art. In the following description, numerous specific details are set forth, such as specific materials, dimensions, concentrations, and processes parameters etc. to provide a thorough understanding of the subject matter. In other instances, well-known semiconductor design and fabrication techniques have not been described in particular detail to avoid unnecessarily obscuring the subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

The NVM transistor may include memory transistors or devices implemented related to Silicon-Oxide-Nitride-Oxide-Silicon (SONOS), Metal-Oxide-Nitride-Oxide-Silicon (MONOS) or floating gate technology. An embodiment of a method for integrating or embedding NVM transistors into a standard or baseline CMOS process flow for fabricating one or more type of MOS transistors, which may include HV select gates, HV gates, Input/Output (I/O) gates, low voltage (LV) gates with high-K metal gates (HKMGs), will now be described in detail with reference to FIGS. 1 through 6J. FIGS. 4A and 4B are a combined flowchart illustrating embodiments of a method or process flow for fabricating the memory cell or array or CMOS device in various stages and alternative methods. FIGS. 5A-5L and 6A-6J are block diagrams illustrating cross-sectional views of a portion of a 2T memory cell and CMOS device during fabrication according to the method of FIGS. 4A and 4B, respectively. FIG. 6K is a representative diagram illustrating a cross-sectional view of a portion of an embodiment of the finished 2T memory cell or array or semiconductor device.

Summary of Subject Matter

According to one embodiment, a method for fabrication of a memory device may include the process steps of forming a first gate oxide layer overlying first and second regions of a substrate, removing a first portion of the first gate oxide layer to create a first opening in the first region, forming a dielectric stack in the first opening and overlying the first gate oxide layer, patterning the dielectric stack to form a non-volatile (NV) gate stack in the first region, removing the first gate oxide layer from second and third areas of the second region, forming a second gate oxide layer in the second area and a third gate oxide layer in the third area of the second region, forming a high dielectric constant (high-K) dielectric layer and a dummy polysilicon gate layer overlying the dielectric stack and the first gate oxide layer in the first region and the first, second, and third gate oxide layers in the second region, etching down the dummy polysilicon gate layer overlying the NV gate stack, patterning the dummy polysilicon gate and high-K dielectric layers, and respectively the NV gate stack and the first gate oxide layer to form a non-volatile memory (NVM) transistor and a select transistor in the first region, and replacing the dummy polysilicon gate layer in the NVM and select transistors with a metal layer.

In one embodiment, the method may also include the process steps of patterning the first gate oxide, dummy polysilicon gate and high-K dielectric layers to form a high voltage (HV) metal-oxide-silicon (MOS) transistor in a first area of the second region, patterning the second gate oxide, dummy polysilicon gate and high-K dielectric layers to form an input/output (I/O) MOS transistor in the second area of the second region, and patterning the third gate oxide, dummy polysilicon gate, and high-K dielectric layers to form a low voltage (LV) MOS transistor in the third area of the second region.

In one embodiment, the first gate oxide layer may be formed to have greater thickness than the second gate oxide layer, and the second gate oxide layer may be formed to have greater thickness than the third gate oxide layer.

In one embodiment, in which forming the second gate oxide layer in the second area may further include the process step of performing a radical oxidation to concurrently form the second oxide layer and oxidize a top portion of the NV gate stack to form a blocking oxide layer.

In one embodiment, the method may also include the process steps of forming a patterned mask exposing the dummy polysilicon gate layer overlying the NV gate stack, and performing a polysilicon etch process to thin down the dummy polysilicon gate layer above the NV gate stack such that top surfaces of the dummy polysilicon gate layer above the NV gate stack in the first region and above the first gate oxide layer in the first and second regions are approximately coplanar.

In one alternative embodiment, the method may also include the process steps of forming a patterned mask such that the dummy polysilicon gate layer overlying the NV gate stack in the first region and the first gate oxide layer in the first and second regions is exposed, and performing a polysilicon etch process through the patterned mask to thin down the dummy polysilicon gate layer such that top surfaces of the dummy polysilicon gate layer above the NV gate stack, the first gate oxide layer in the first and second regions, and the second and third gate oxide layer in the second region are approximately coplanar.

In one embodiment, the method may also include the process steps of forming a stress inducing silicon nitride layer and an interlevel dielectric layer (ILD) overlying the substrate, and performing a chemical-mechanical polishing (CMP) process until at least one of the dummy polysilicon gate layers of the NVM transistor and the select transistor in the first region is exposed.

In one embodiment, in which replacing the dummy polysilicon gate layer may also include the process steps of performing a polysilicon etch to remove the dummy polysilicon gate layer in the NVM transistor and the select transistor, wherein the NVM and select transistors form a two-transistor memory cell in the first region, depositing a first metal gate layer overlying the high-K dielectric layer in the NVM transistor and the select transistor, and depositing a second metal gate layer overlying the first metal gate layer.

In one embodiment, the NVM and select transistor may be of n-channel type, in which the first metal gate layer in the NVM transistor may include high work function metal, wherein the high work function metal includes at least one of aluminum, titanium, and compounds or alloys thereof, and the first metal gate layer in the select transistor may include low work function metal, wherein the low work function metal includes at least one of titanium, lanthanum, aluminum, and compounds or alloys thereof.

In one embodiment, in which the select transistor in the first region and the HV MOS transistor in the second region may be formed concurrently, and the first gate dielectric in the select and HV_MOS transistors may be in an approximate range of 110 Å to 160 Å, and the select transistor may be configured to operate in a voltage range of 4.5 V to 12 V for program or erase operations of the NVM transistor.

According to another embodiment, a method for fabrication of a memory device may include the process steps of forming a two-transistor (2T) memory cell in a memory region of a substrate, forming a high voltage (HV) gate oxide layer in the memory region and a logic region of the substrate, forming a first opening in the memory region, and forming a non-volatile (NV) dielectric stack in the first opening and a select gate oxide stack outside the first opening, forming a HV gate oxide stack, an input/output (I/O) gate oxide stack, and a low voltage (LV) gate oxide stack in the logic region, wherein the select gate oxide stack and the HV gate oxide stack have a same thickness, depositing a high dielectric constant (high-K) dielectric layer and a dummy polysilicon gate layer in the memory and logic regions, etching down a portion of the dummy polysilicon gate layer in the memory region, patterning the dummy polysilicon gate and high-K dielectric layers, patterning the NV gate dielectric stack and the select gate oxide stack to form a non-volatile memory (NVM) transistor and a select transistor respectively in the memory region, patterning the HV, I/O, and LV gate oxide stacks to form HV, I/O, and LV transistors respectively, and replacing the dummy polysilicon gate layers respectively in the NVM, select, HV, I/O, and LV transistors with multi-level metal gate layers.

In one embodiment, the 2T memory cell, the HV, I/O, and LV transistors may be formed within one single semiconductor package.

In one embodiment, the select gate oxide and HV gate oxide stacks may be formed concurrently and thicker than the I/O gate oxide stack, and the I/O gate oxide stack may be formed thicker than the LV gate oxide stack.

In one embodiment, the method may further include the process steps of forming a patterned mask exposing the dummy polysilicon gate layer overlying the NV gate dielectric stack, and performing a polysilicon etch process to thin down the dummy polysilicon gate layer above the NV gate dielectric stack such that top surfaces of the dummy polysilicon gate layer above the NV gate dielectric and select gate oxide stacks are approximately coplanar.

In one embodiment, the method may further include the process steps of forming a patterned mask such that the dummy polysilicon gate layer in the memory region and disposed above the HV gate oxide stack in the logic region is exposed, and performing a polysilicon etch process through the patterned mask to thin down the dummy polysilicon gate layer.

In one embodiment, the method may further include the process steps of forming a stress inducing silicon nitride layer an interlevel dielectric layer (ILD) in the memory and logic regions, and performing a chemical-mechanical polishing (CMP) process until at least one of the dummy polysilicon gate layers of the NVM transistor and the select transistor in the memory region is exposed.

In one embodiment, in which replacing the dummy polysilicon gate layer may further include the process steps performing a polysilicon etch operation to remove the dummy polysilicon gate layer in the NVM transistor and the select transistor, depositing a first metal gate layer overlying the high-K dielectric layer in the NVM transistor and the select transistor, and depositing a second metal gate layer overlying the first metal gate layer.

In one embodiment, the NVM and select transistors may be of n-channel type, and wherein the first metal gate layer in the NVM transistor may include low work function metal, wherein the low work function metal includes at least one of titanium, lanthanum, aluminum, and compounds or alloys thereof, and the first metal gate layer in the select transistor may include low work function metal, wherein the low work function metal includes at least one of titanium, lanthanum, aluminum, and compounds or alloys thereof.

In one embodiment, a combined thickness of the high-K dielectric layer and the select gate oxide stack of the select transistor may be in an approximate range of 110 Å to 160 Å, and the select transistor may be configured to operate in an approximate range of 4.5 V-12 V for program/erase operations of the 2T memory cell.

In one embodiment, etching down a portion of the dummy polysilicon gate layer in the memory region may further include the process step of removing an approximate 90 Å to 110 Å of the dummy polysilicon gate layer disposed above the NV gate dielectric stack such that the NVM transistor and the select transistor have an approximate same height.

In one embodiment, the NVM, select, HV, I/O, and LV transistors may have an approximately same height.

According to yet another embodiment, a method for fabrication of a memory device may include the process steps of forming a non-volatile (NV) dielectric stack and a first gate oxide in a first region of a substrate and second and third gate oxides in a second region of the substrate, forming a high dielectric constant (high-K) dielectric layer and a dummy polysilicon gate layer overlying the NV dielectric stack and the first, second, and third gate oxides, etching down the dummy polysilicon gate layer overlying the NV dielectric stack, patterning the dummy polysilicon gate and high-K dielectric layers, and respectively the NV dielectric stack and the first gate oxide to form a non-volatile memory (NVM) transistor and a select transistor in the first region, and replacing the dummy polysilicon gate layer in the NVM and select transistors with a metal layer, wherein the NV dielectric stack may be formed subsequent to the first gate oxide, and wherein the first, second, and third gate oxides may be formed separately, the first gate oxide being thicker than the second gate oxide, and the second gate oxide being thicker than the third gate oxide.

Detailed Embodiments of Subject Matter

Figure 1B:
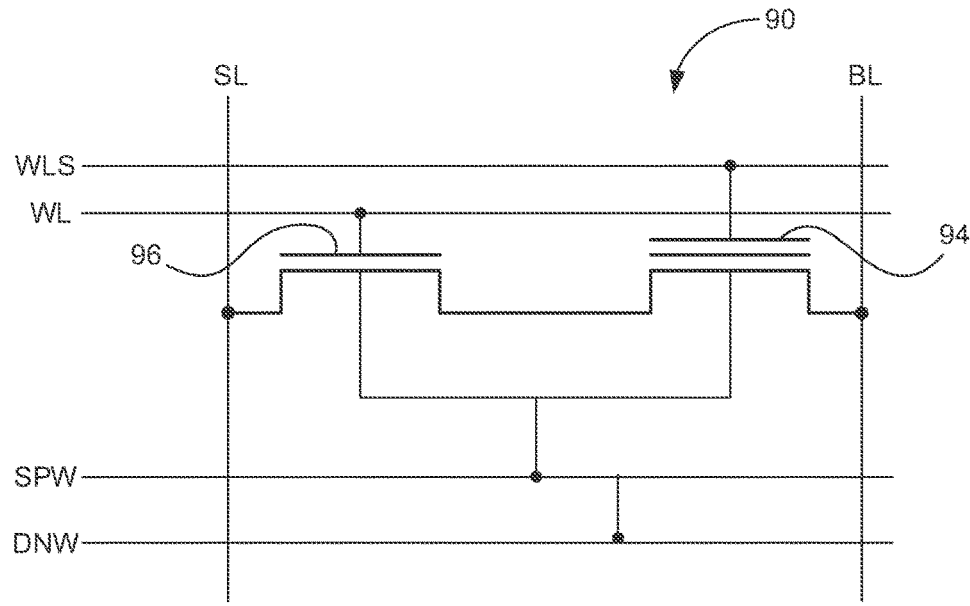
FIG. 1B illustrates a corresponding schematic diagram of the SONOS based non-volatile memory transistor or device depicted in FIG. 1A.

FIG. 1A is a block diagram illustrating a cross-sectional side view of a non-volatile memory cell, and its corresponding schematic diagram is depicted in FIG. 1B. A non-volatile memory (NVM) array or device may include NVM cells with a non-volatile memory transistor or device implemented using Silicon (Semiconductor)-Oxide-Nitride-Oxide-Silicon (Semiconductor) (SONOS) or floating gate technology, and a field-effect transistor (FET) disposed adjacent or coupled to one another.

In one embodiment, illustrated in FIG. 1A, the non-volatile memory transistor is a SONOS-type charge trapping non-volatile memory transistor. Referring to FIG. 1A, NVM cell 90 includes a control gate (CG) or memory gate (MG) stack of NV transistor 94 formed over substrate 98. NVM cell 90 further includes source 97/drain 88 regions formed in substrate 98, or optionally within shallow positive well (SPW) 93 in substrate 98, on either side of NV transistor 94. SPW 93 may be at least partly encapsulated within deep negative well (DNW) 99. In one embodiment, source/drain regions 88 and 97 are connected by channel region 91 underneath NV transistor 94. NV transistor 94 may include an oxide tunnel dielectric layer, a nitride or oxynitride charge-trapping layer 92, an oxide top or blocking layer, forming the ONO stack. In one embodiment, charge-trapping layer 92 may be multiple layered and traps charges injected from substrate 98 by Fowler-Nordheim (FN) tunneling. Threshold voltage ($V_T$) and drain current ($I_D$) values of NV transistor 94 may change at least partly due to the amount of trapped charges. In one embodiment, a high K dielectric layer may form at least a portion of the blocking layer. A poly-silicon (poly) or metal gate layer disposed overlying the ONO layer, which may serve as a control gate (CG) or memory gate (MG). As best shown in FIG. 1A, NVM cell 90 further includes a FET 96 disposed adjacent to NV transistor 94. In one embodiment, FET 96 includes a metal or polysilicon select gate (SG) disposed overlying an oxide or high-K dielectric gate dielectric layer. FET 96 further includes gate oxide layer 82, source/drain regions 86 and 97 formed in substrate 98, or optionally within well 93 in substrate 98, on either side of FET 96. As best shown in FIG. 1A, FET 96 and NV transistor 94 may share source/drain region 97 disposed in-between, or referred to as internal node 97. SG is appropriately biased $V_{SG}$ to open or close the channel 95 underneath FET 96. NVM cell 90, as illustrated in FIG. 1A, is considered having a two-transistor (2T) architecture, wherein NV transistor 94 and FET 96 may be considered the memory or NVM transistor and the select or pass transistor, respectively throughout this patent document. In one embodiment, select transistor 96 may be an Input/Output (I/O) transistor having a relatively thin gate oxide layer 82, in an approximate range of 50 Å-70 Å and operating in an approximate voltage range of 1.8 V-3.6 V. Due to height difference between the ONO layer of the NV transistor 94 and the thin I/O oxide layer 82, there may be a step height difference 80 between the two transistors 94 and 96. In the embodiments as disclosed in this patent document, select transistor 96 may be replaced with a HV transistor, having a thick gate oxide layer 82, in an approximate range of 110 Å-160 Å and operating in an approximate voltage range of 4.5 V-12 V. The thicker gate oxide layer 82 of a HV transistor may help reduce its step height difference 80 to the NV transistor 94, enable program/erase voltages of NVM cell 90 to be significantly higher, e.g. 9 V, and improve the Vt window and the end-of-life (EOL) margin. As will be illustrated hereafter, step height difference 80 among different transistors may pose practical difficulties during metal gate fabrication in a HKMG process flow.

In one embodiment, FIG. 1B depicts a two-transistor (2T) SONOS NVM cell 90 with non-volatile (NV) transistor 94 connected in series with FET 96. NVM cell 90 is programmed (bit value "1") when CG is appropriately biased by $V_{CG}$, or by applying a positive pulse on CG with respect to substrate 98 or well 93 that causes electrons to be injected from the inversion layer into charge-trapping layer 92 by FN tunneling. The charge trapped in the charge-trapping layer 92 results in an electron depletion between the drain 88 and the source 97, raising the threshold voltage ($V_T$) necessary to turn on the SONOS based NV transistor 94, putting the device in a "programmed" state. NVM cell 90 is erased by applying an opposite bias $V_{CG}$ on the CG, or a negative pulse on CG, with respect to substrate 98 or well 93 causing FN tunneling of holes from the accumulated channel 91 into the ONO stack. Programmed and erased threshold voltages are called "Vtp" and "Vte" respectively. In one embodiment, NV transistor 94 may also be in an inhibit state (bit value "0") wherein a previously erased cell (bit value "0") is inhibited from being programmed (bit value "1") by applying a positive voltage on the source and drain of NVM cell 90 while control gate (CG) is pulsed positive with respect to substrate 98 or well 93 (as in the program condition).

In another embodiment, the NV transistor 94 may be a floating-gate MOS field-effect transistor (FGMOS) or device. Generally, FGMOS is similar in structure to the SONOS based NV transistor 94 described above, differing primarily in that a FGMOS includes a poly-silicon (poly) floating gate, which is capacitively coupled to inputs of the device, rather than a nitride or oxynitride charge-trapping layer 92. Thus, the FGMOS device can be described with reference to FIGS. 1A and 1B, and operated in a similar manner.

Similar to the SONOS based NV transistor 94, the FGMOS device may be programmed by applying an appropriate bias $V_{CG}$ between the control gate and the source and drain regions, raising the threshold voltage $V_T$ necessary to turn on the FGMOS device. The FGMOS device can be erased by applying an opposite bias $V_{CG}$ on the control gate.

In one embodiment, source/drain region 86 may be considered as the "source" of NVM cell 90, and coupled to $V_{SL}$, while source/drain region 88 as the "drain", and coupled to $V_{BL}$. Optionally, SPW 93 is coupled with $V_{SPW}$ and DNW 99 with $V_{DNW}$.

FET 96 may prevent hot carrier electron injection and junction breakdown during program or erase operations. FET 96 may also prevent large currents from flowing between source 86 and drain 88, which may cause high energy consumption and parasitic voltage drops in the memory array. As best shown in FIG. 1A, both FET 96 and NV transistor 94 may be n-type or n-channel transistors, wherein source/drain regions 86, 88, 97, and DNW 99 are doped with n-type material while SPW 93 and/or substrate 98 is doped with p-type material. It will be the understanding that NVM cell 90 may also include, additionally or alternatively, p-type or p-channel transistors, wherein the source/drain regions and well(s) may be doped oppositely, or differently according to the practice of ordinary skill in the art.

A memory array is constructed by fabricating a grid of memory cells, such as NVM cells 90, arranged in rows and columns and connected by a number of horizontal and vertical control lines (not shown in FIG. 2) to peripheral circuitry such as address decoders and comparators such as analog-to-digital (ADC) and digital-to-analog (DAC) functions. Each memory cell includes at least one non-volatile semiconductor device, such as those described above, and may have a one-transistor (1T), or two-transistor (2T) architecture as described in FIG. 1A, and may further includes LV or core transistor(s) and additional HV transistor(s).

Figure 2:
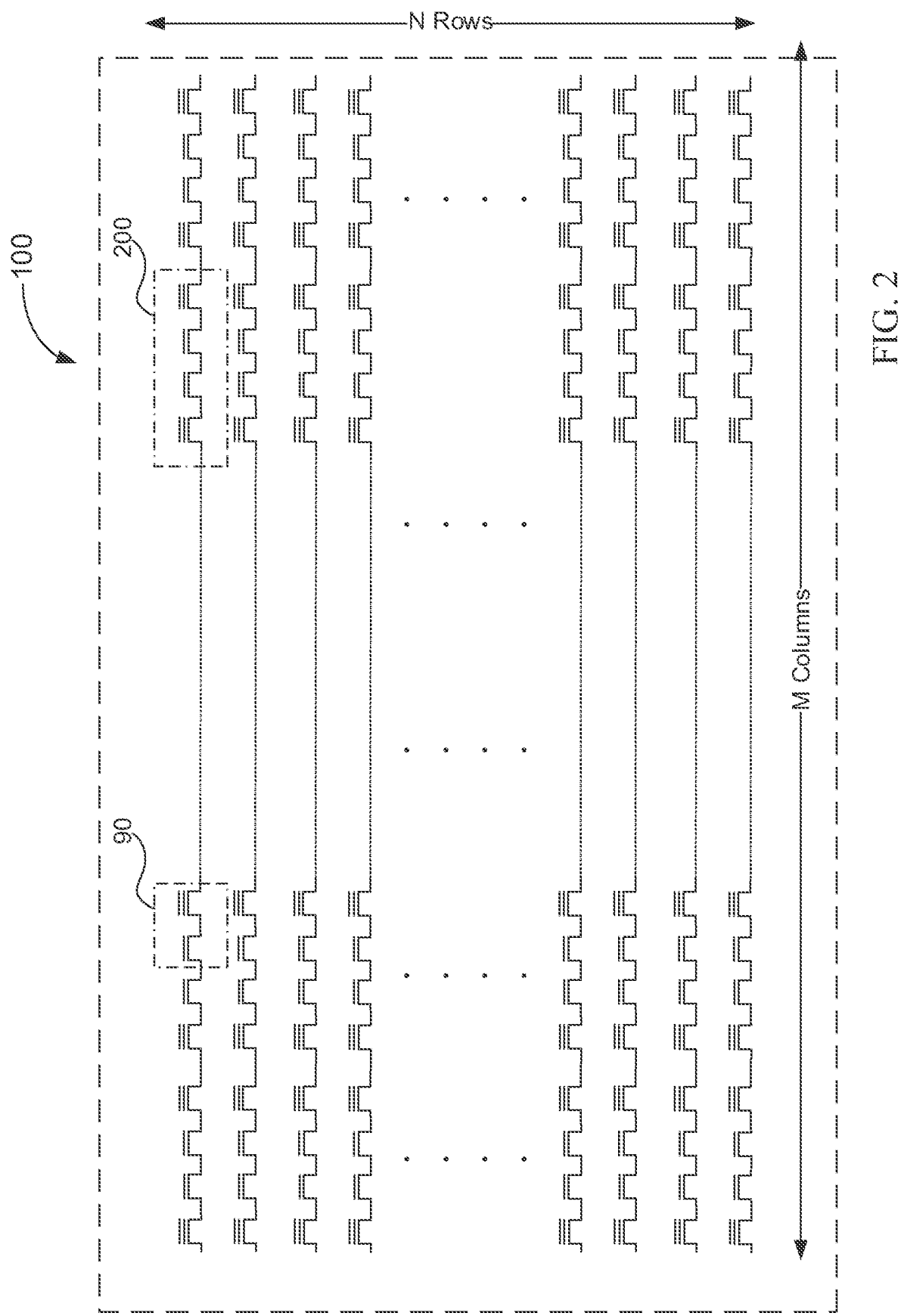
FIG. 2 is a schematic diagram illustrating a SONOS based non-volatile memory array according to one embodiment of the present disclosure.

FIG. 2 is a schematic diagram illustrating an NVM array in accordance with one embodiment of the subject matter. In one embodiment, illustrated in FIG. 2, memory cells 90 may have a 2T architecture and each includes, in addition to a non-volatile memory transistor, a pass or select transistor, for example, a HV MOSFET sharing a common substrate connection, or internal node, with the memory transistor. In one embodiment, NVM array 100 includes NVM cells 90 arranged in N rows or page (horizontal) and M columns (vertical). NVM cells 90 in the same row may be considered to be in the same page. In some embodiments, several rows or pages may be grouped together to form memory sectors. It should be appreciated that the terms "rows" and "columns" of a memory array are used for purposes of illustration, rather than limitation. In one embodiment, rows are arranged horizontally and columns are arranged vertically. In another embodiment, the terms of rows and columns of memory array may be reversed or used in an opposite sense, or arranged in any orientation.

In one embodiment, a SONOS word line (WLS) is coupled to all CGs of NVM cells 90 of the same row, a word line (WL) is coupled to all SGs of NVM cells 90 of the same row. A bit lines (BL) are coupled to all drain regions 88 of NVM cells 90 of the same column, while a common source line (CSL) or region 86 is coupled or shared among all NVM cells in the array, in one embodiment. In one alternative embodiment, a CSL may be shared between two paired NVM cells of the same row. An CSL also couples to shared source regions of all NVM pairs of the same two columns.

Referring to FIG. 2, NVM cells 90 may be arranged in pairs, such as NVM cell pair 200. In one embodiment, NVM cell pair 200 may include two NVM cells 90 having a mirrored orientation, such that select transistors of each NVM cell, are disposed adjacent to one another. NVM cells 90 of the same NVM cell pair 200 may also share a common source region, receiving the voltage signal $V_{CSL}$.

Figure 3:
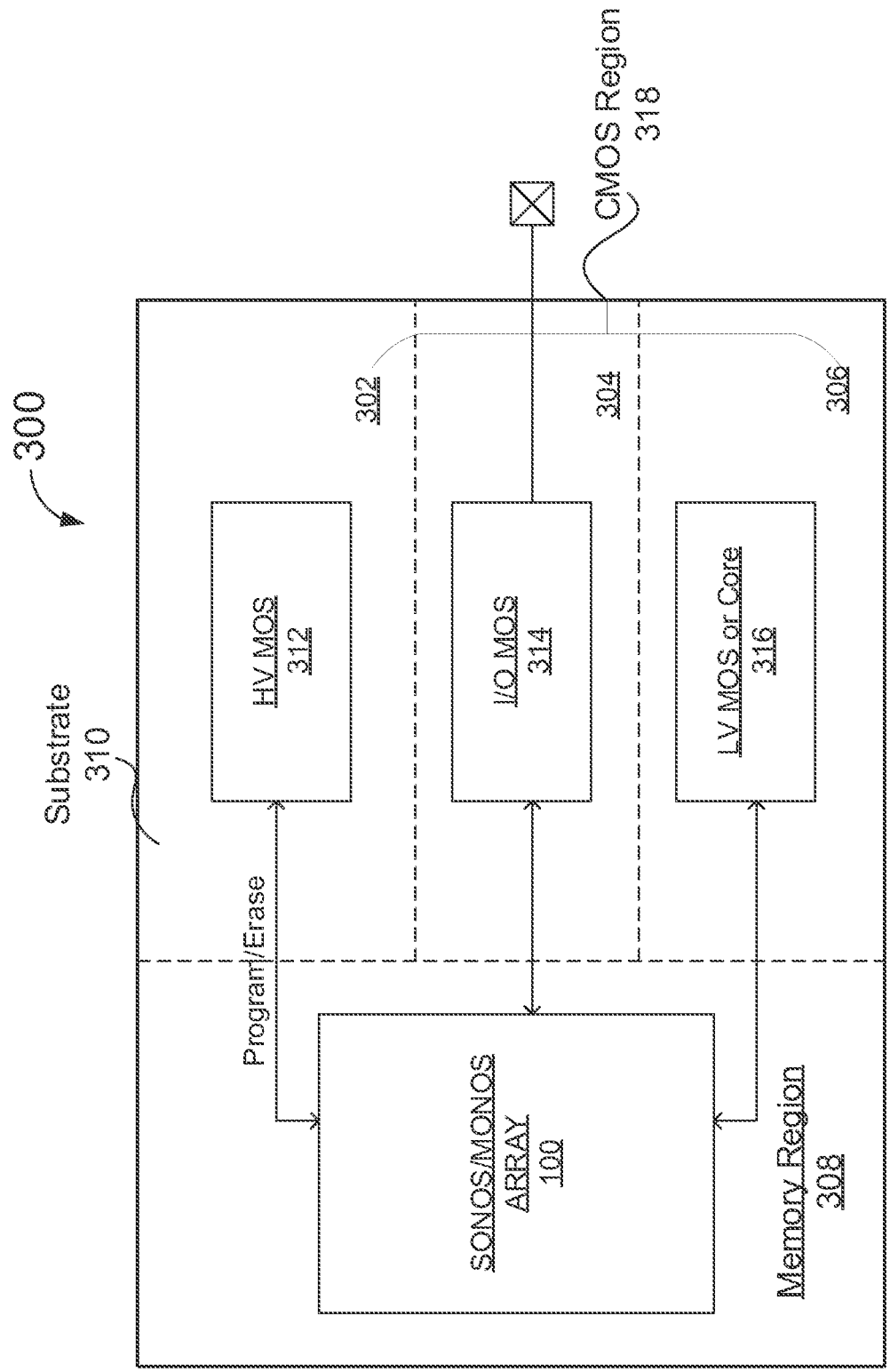
FIG. 3 is a representative block diagram illustrating one embodiment of embedded SONOS or MONOS based NVM device 300 according to the present disclosure.
Figure 4A:
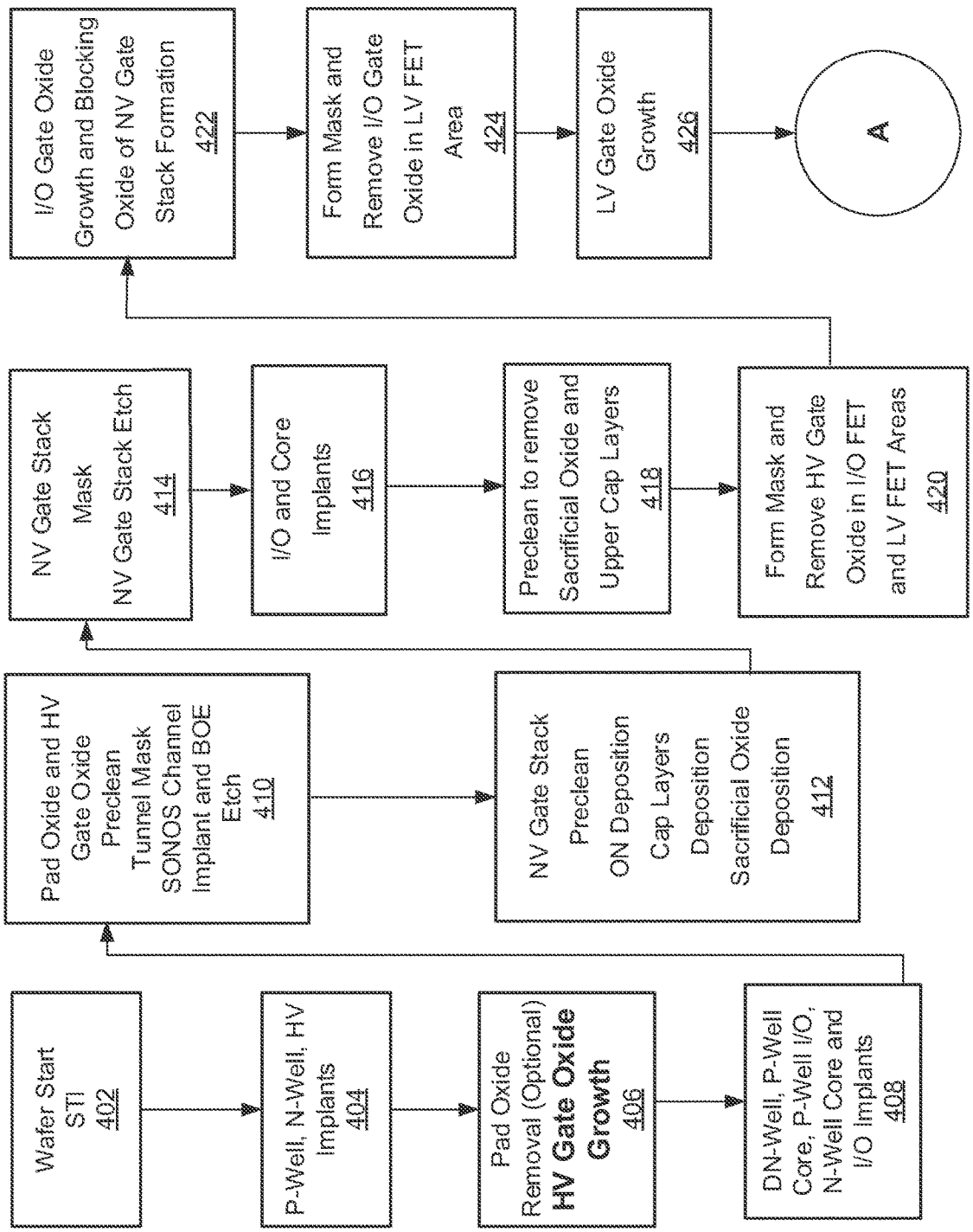
FIGS. 4A and 4B is a combined flowchart illustrating an embodiment of a method for fabricating embedded SONOS based NVM transistor and MOS transistor (two transistor (2T)) memory cells and CMOS devices in FIG. 6K.
Figure 4B:
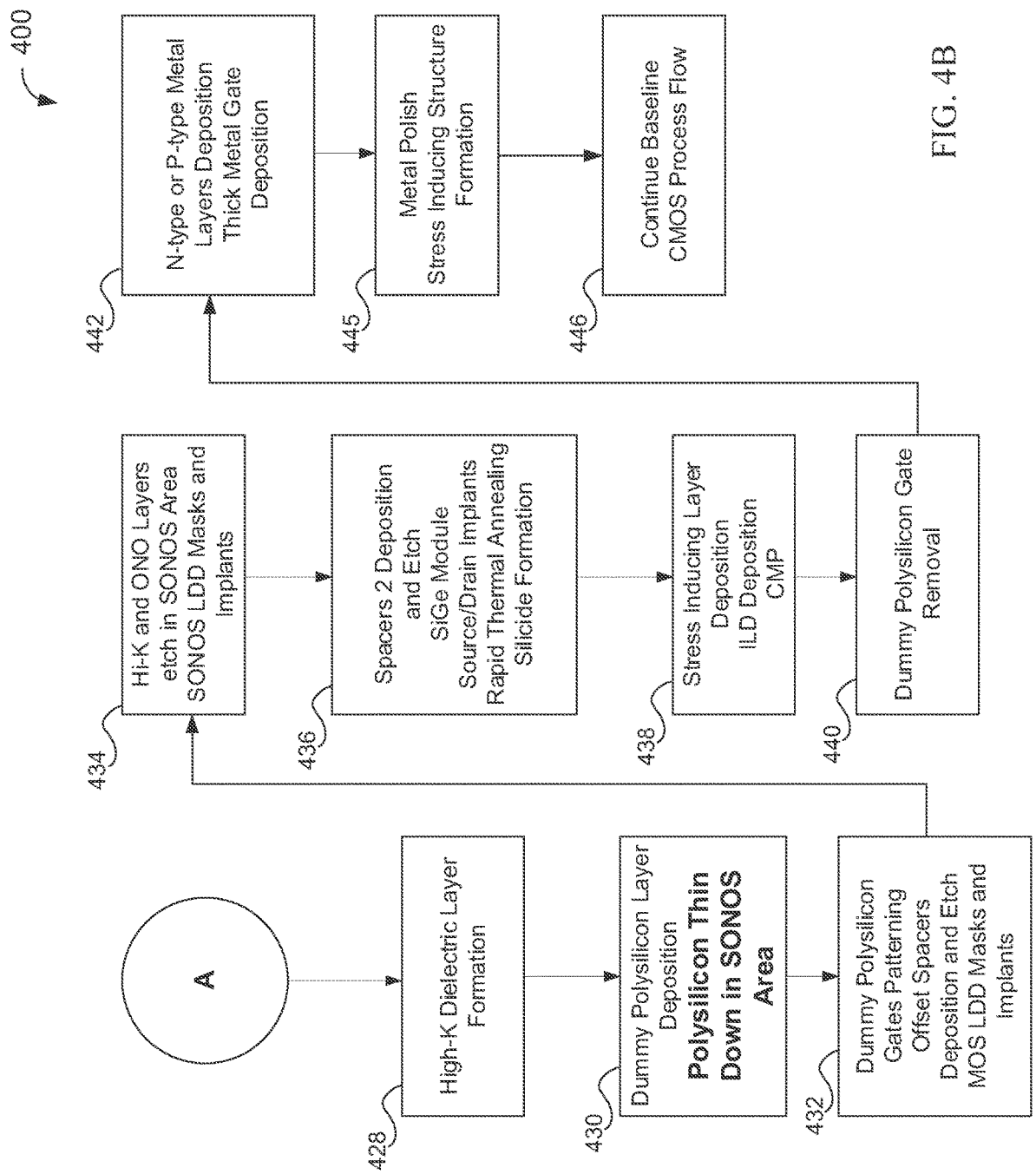

FIG. 3 is a representative block diagram illustrating embedded SONOS or MONOS based NVM device 300, as fabricated in FIGS. 4A to 6J. In one embodiment, embedded SONOS or MONOS based NVM device 300 is formed in a single semiconductor die or substrate 310. The semiconductor die or substrate 310 is at least divided into the first or memory region 308 for embedded memory, such as NVM array 100 and the second or CMOS or logic region for HV MOS transistors 312, I/O MOS transistors 314, and LV MOS transistors 316. In some embodiments, there may be MOS transistors in the first region 308 as some NVM memory arrays may include HV select transistors. For example, a two-transistor (2T-memory gate/select gate) configuration memory array having HV transistors as the select transistors. The second region 318 may be further divided into HV_MOS area 302, I/O_MOS area 304, and LV_MOS or Core area 306. It will be the understanding that embedded SONOS or MONOS based NVM device 300 may include other devices, such as processors, power circuits, etc. In various embodiments, the first and second regions may be overlapping, and the HV_MOS area 302, I/O_MOS area 304, and LV_MOS or core area 306 may be overlapping. In will be the understanding that embodiment illustrated in FIG. 3 is only exemplary, and the first region 308 and the HV_MOS area 302, I/O_MOS area 304, and LV_MOS or core area 306 may be located in any location of single substrate 300 or multiple substrates, and may be made up of various different regions.

In one embodiment, HV_MOS 312 and select transistors in SONOS/MONOS array 100 may have the same or similar structural features (e.g. gate oxide thickness) and be provided with a high voltage in a range of 4.5 V-12 V in order to program and/or erase NVM transistors in NVM array 100. I/O_MOS may be coupled to I/O interface and provided with an operation voltage in a range of 1.6 V-3.6 V. LV_MOS or core MOS 212 may be provided with an operation voltage in a range of 0.8 V-1.4 V for various operations and connections.

In one embodiment, select transistors may be HV_MOS transistors and thus require a thick gate oxide having an approximate thickness of up to 100 Å to 200 Å. In some process flows, HV_MOS gate oxide and NVM blocking oxide are formed concurrently. While the HV_MOS gate oxide may be formed/grown to its required thickness, since blocking or top oxide of the NVM transistor is subjected to the same environment during oxidation of the gate oxide of HV_MOS transistor(s), it may be grown to be too thick. As a result, the NVM transistor may not meet the requirements for EOT and program/erase Vts and worsen the step height difference 80 as best shown in FIG. 1A.

In this disclosure, a process to embed an Oxide-Nitride-Oxide (ONO) or ONONO charge trapping stack with single-layer or bi-layer nitride into a CMOS process that includes HKMGs and/or a thick gate oxide for the select gate and HV devices is introduced and described. In some embodiments, the aforementioned ONO stack formation sequence may not be appropriate for CMOS process flows, especially when HKMG process flow is included, that includes fabrication of thick gate oxide layers for some of the select gate and HV_MOS transistors. In such a process flow, in-situ steam generation (ISSG) or radical oxidation process may not be ideal for the gate oxidation for both top or blocking oxide layer of the NVM transistors and gate oxide layer for the select and HV_MOS transistors. In order to achieve the targeted thickness of gate oxide of the select and HV_MOS transistors, top oxide grown on the ONO stack may be exposed to the ISSG process for too long and end up being too thick, resulting in high step height difference 80, as best shown in FIG. 1A. Alternatively, gate oxides of the select and HV_MOS transistors may be grown by either a furnace process or a rapid thermal oxidation (RTO) process. In those embodiments, the furnace process or RTO process may effect moisture from isolation structures, such as shallow trench isolation (STI) dielectric, to diffuse to the ONO film, and change the thickness or uniformity of thickness of the critical tunnel oxide layer of the NVM transistors. As a result, threshold voltage of the NVM transistors may be degraded. Moreover, furnace and RTO processes are generally operated at very high temperature (up to approximately 1100° C.). The high temperature may cause changes in trap density of the nitride layer of the ONO stack, which may also degrade the threshold voltage of the NVM transistors. Additionally, when a high-K dielectric layer is added overlying or as a part of the top oxide or oxynitride of the NVM transistors, the added thickness may degrade the performance of the NVM transistors. In some embodiments, the high step height difference may lead to undesirable silicon nitride residue on top of the select and HV_MOS transistors or other MOS transistors during a chemical mechanical planarization (CMP) process of the HKMG fabrication.

To address the above issues as well as other issues, the embodiments disclosed herein include processes that may enhance the retention performance of NVM transistors, such as SONOS or MONOS. At least one of the SONOS or MOS transistors may include a high-K dielectric layer and a metal gate. A Triple Gate Oxide approach is introduced that allows the use of a high voltage for programming/erasing of SONOS, which in turn makes the sensing threshold voltage (Vt) window much larger at the End-of-Life (EOL) of SONOS memory cells. At the same time, the embodiments disclosed are able to support the widely used I/O voltage of 1.6 V to 3.6 V, with the I/O_MOS transistors.

Further, embodiments depicted herein may be directed to fabrication processes that ensure that the ONO stack of the NVM transistors meets the thickness and reliability requirements without degradation of the ONO stack performance, due to the HKMG process flow and thick gate layer oxidation of the select transistors or HV_MOS and/or I/O_MOS transistors in an embedded system.

Referring to FIG. 4A and FIG. 5A, the process begins with forming a number of isolation structures or shallow trench isolation (STI) 502 in a wafer or substrate 504 (step 402). The isolation structures 502 isolate the memory cell being formed from memory cells formed in adjoining areas (not shown) of the substrate 504. Optionally and additionally, isolation structures 502 may be incorporated to isolate the NVM transistor(s) being formed from the HV select transistor(s) in a first or memory region 308 of the substrate 504 and from one or more of the MOS transistors including HV_MOS, I/O_MOS, and LV_MOS, being formed in a second or CMOS region 318. As illustrated in FIG. 5A, isolation structures 502 may be formed to isolate HV_MOS area 302, I/O_MOS area 304, and LV_MOS area 306 from one another and/or those areas to isolate formed transistors therein. It will be the understanding that isolation structures 502 may be formed anywhere in substrate 504 according to system design and requirements, and are not limited to those being shown or not shown in FIG. 5A and following figures.

In one embodiment, the isolation structures 502 may include a dielectric material, such as oxide or nitride, and may be formed by any conventional technique, including but not limited to shallow trench isolation (STI) or local oxidation of silicon (LOCOS). The substrate 504 may be a bulk substrate composed of any single crystal material suitable for semiconductor device fabrication, or may include a top epitaxial layer of a suitable material formed on a substrate. In one embodiment, suitable materials for substrate 504 include, but are not limited to, silicon, germanium, silicon-germanium or a Group III-V compound semiconductor material. In some embodiments, there may be MOS transistors, such as HV_MOS transistors 312, in the first region 308. This is because certain NVM memory arrays may include HV_MOS transistors as select transistors, e.g. in a two-transistor (2T) memory array, such as NVM array 100 in FIG. 2.

Optionally and in some embodiments, as best shown in FIG. 5A, pad oxide 509 may be formed over a surface 516 of the substrate 504 in both the first region 308 and the second region 318. In one embodiment, pad oxide 509 may be silicon dioxide ($SiO_2$) having a thickness of from about 10 nanometers (nm) to about 20 nm or other thicknesses and may be grown by a thermal oxidation process or in-situ steam generation (ISSG) process, or other oxidation or deposition processes known in the art. It will be the understanding that pad oxide 509 may not be necessary, or formed in some embodiments.

Referring to FIG. 1 and FIG. 5B, dopants are then implanted into substrate 504 through pad oxide 509 (if present) to form wells in which the NVM transistor(s) and/or the HV_MOS transistors may be formed, and channels for the HV_MOS transistors (step 404). According to system design, there may or may not be isolation structures 502 disposed between the first region 308 and the second region 318. One having ordinary skill in the art would understand that isolation structures 502 may be formed anywhere in substrate 504 as required, and shall not be limited to the ones shown or not shown in the figures. The dopants implanted may be of any type and concentration, and may be implanted at any energy, including energies necessary to form wells or deep wells for the NVM transistors and/or the HV_MOS transistors, and to form channels for the HV_MOS transistors. In one particular embodiment, illustrated in FIG. 5B as an example, dopants of an appropriate ion species are implanted to form a P-well 510 in the second region 318 over or in HV_MOS transistor area 302, in which one or more N-type or N-channel transistor, may be formed. In other embodiments, wells or deep wells may also be formed for the NVM array 100 including eventual SONOS 326 and/or select transistor 327 in the first region 308. It is further appreciated that the wells, such as P-well 510, may be formed by depositing and patterning a mask layer, such as a photoresist layer above surface 516 of substrate 504, and implanting an appropriate ion species at an appropriate energy to an appropriate concentration. It would be the understanding that there may be both P-type and/or N-type transistors in first region 308 and/or second region 318, and dopants implantation conditions may be adjusted accordingly. The locations, quantity, and types of NVM transistor(s) 326, select transistor(s) 327, HV_MOS 312, I/O_MOS 314, and LV_MOS 316 illustrated in FIG. 5B and other figures are merely for illustrative purposes, and should not be construed as limitations. One having ordinary skill in the art would understand and appreciate that multiple first and second regions, MOS areas 302, 304, 306 may be formed within substrate 504. One or more respective NVM transistor 326, select transistor 327, HV_MOS 312, I/O_MOS 314, and LV_MOS 316 may be formed concurrently, or subsequently, or in groups using the process steps disclosed in the present disclosure.

In one embodiment, channels 518 for one or more of select transistor 327 in the first region 308 and HV_MOS transistors 312 in the second region 318 of substrate 504 may be formed. It will be the understanding that channels 518 of select 327 and HV_MOS 312 transistors may or may not be formed concurrently. As with the well implant, channels 518 may be formed by depositing and patterning a mask layer, such as a photoresist layer above the surface 516 of substrate 504, and implanting an appropriate ion species at an appropriate energy to an appropriate concentration. In one embodiment, for example, $BF_2$ may be implanted at an energy of from about 10 kilo-electron volts (keV), to about 100 keV, and a dose of from about 1e12 $cm^{-2}$ to about 1e14 $cm^{-2}$ to form an N-type MOS (NMOS) transistor. A P-type MOS (PMOS) transistor may likewise be formed by implantation of arsenic (As) or phosphorous (P) ions at any suitable dose and energy. It is appreciated that implantation may also be used to form channels, in all three of the MOS areas 302, 304, and 306 at the same time, or at separate times using standard lithographic techniques, including a patterned photoresist layer to mask one of the channels for the MOS transistors 312, 314, 316.

Next, referring to FIG. 4A and FIGS. 5C and 5D, HV gate oxide 552 layer is formed on substrate 504 (step 406), either directly or indirectly. In one embodiment, HV gate oxide 552 layer is formed before NVM stack 536 in the first region 308 (see FIG. 5F), which a HV gate oxide first approach is adopted. It is the understanding that it may take an extended period for the oxidation process (RTO or furnace oxidation) to grow a relatively thick HV gate oxide 552 layer. During the long oxidation process, if the NVM stack 536 is present, it may affect oxide growth in tunnel dielectric 528 of NV gate stack 536. As a result, tunnel dielectric 528 may have an unexpectedly thick structure which may adversely affect the operations of the eventual NVM transistor 526. In one embodiment, the electrical performance of NVM transistor 526, such as programming/erasing by tunneling, may be degraded. Another potential issue with the relatively long HV gate oxide 552 layer growth is that moisture in STIs 502 oxide (not shown) may also creep in under NV gate stack 536 and increase the tunnel dielectric 528 thickness. Both these mechanisms may lead to significant increase in tunnel dielectric 528 thickness, resulting in degradation of the tunneling of electrons/holes during programming/erasing, and the Program/Erase Vts and Vt window of the eventual NVM transistor 206.

In one embodiment, the process starts when pad oxide 509 is partially (FIG. 5C) or completely (FIG. 5D) removed in a pad oxide preclean process. The pad preclean may involve, for example a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. After pad oxide 509 is removed either partially or completely, HV gate oxide 552 layer may be formed by a rapid thermal dry oxidation (RTO) process, a conventional or furnace oxidation process, a rapid and radical wet oxidation process such as in-situ steam generation (ISSG), a chemical vapor deposition process (CVD), or other oxide forming processes known in the art, or a combination thereof. In one embodiment, since NV gate stack 536 (best shown in FIG. 5G) is yet to be formed, radical oxidation processes, such as ISSG, may be employed as it will not oxidize nitride in NV gate stack 536, as in step 422 of FIG. 4A. In one embodiment, HV gate oxide 552 layer may be formed in both the first region 308 and second region 318, and may eventually become the HV gate oxide for select transistors 308 formed in the first region 308 and HV_MOS transistors 312 in the HV_MOS area 302 of the second region 318.

In one embodiment, as an example, the oxidation process starts with dry RTO performed in a batch or single substrate processing chamber with or without an ignition event such as plasma. For example, the device is subjected to a rapid thermal oxidation process involving flowing oxygen ($O_2$) gas into a processing chamber. The $O_2$ gas is permitted to react at a temperature approximately in the range of 1000-1100° C. at a pressure approximately in the range of 0.5-5 Torr. to form HV gate oxide 552 layer. In one embodiment, HV gate oxide 552 layer is grown, by oxidizing silicon substrate 504, on at least a portion of the surface 516 of substrate 504. In one alternative embodiment, RTO process may be substituted with a rapid molecular oxidation (dry or wet) which is a non-radical oxidation process. In another embodiment, HV gate oxide 552 layer is formed by a wet rapid and radical oxidation process, such as in-situ steam generation (ISSG). The wet rapid and radical oxidation may be performed in a batch or single substrate processing chamber with or without an ignition event such as plasma. For example, in one embodiment, HV gate oxide 552 layer may be grown in a wet radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 1000-1100° C. at a pressure approximately in the range of 0.5-10 Torr. to form radicals, such as, an OH radical, an $HO_2$ radical or an O diradical radicals. The oxidation process is carried out for a duration approximately in the range of 5-10 minutes for a single substrate using an ISSG process, or 30-120 minutes for a batch furnace process to effect growth of HV gate oxide 552 layer. During the period, HV gate oxide 552 layer is grown in both the first and second regions 308 and 318. In alternative embodiments, wet rapid and radical oxidation may be substituted by processes such as chemical vapor deposition (CVD), or other radical oxidation processes performed in a batch or single substrate processing chamber with or without an ignition event such as plasma as long as oxide will be grown or deposited to form HV gate oxide 552 layer. In one embodiment, by controlling operation parameters in the HV gate oxide 552 layer formation, targeted thickness of HV gate oxide 552 layer may be achieved. The parameters may include time duration, temperature, pressure, reactants etc. of the RTO, ISSG, furnace oxidation, and/or CVD processes. As will be explained hereafter, at least a portion of HV gate oxide 552 layer remains in the finished device as HV gate oxide 552 of select transistor 327 and HV_MOS transistors 312. In one embodiment, to withstand the relatively high operating voltage, desirable thickness of HV gate oxide 552 layer may be targeted to be approximately between 100 Å-200 Å, or other thicknesses. It will be understood that such a range is merely illustrative and is not meant to be limiting. In one embodiment, HV gate oxide 552 layer may be formed, in the processes described in FIG. 5C, to be thicker or thinner than the desirable thickness. Excessive or inadequate HV gate oxide 552 layer may be removed or added in later processes to achieve the desirable or final thickness of select gate oxide 552 of select transistor 327 and HV gate oxide 552 of HV MOS transistor 312.

Alternatively, HV gate oxide 552 layer may be formed adjacent to at least a bottom or remaining portion of pad oxide 509 (partially removed in FIG. 5C) and substrate 504. As best illustrated in FIG. 5C, pad oxide 209 is not completely removed during the pad oxide preclean process, as previously described. In one embodiment, the pad oxide preclean process may be omitted. In another embodiment, the pad oxide preclean process is carried out but does not remove the entirety of pad oxide 509. HV gate oxide 552 layer may then be formed in the aforementioned processes at least over or underneath, depending on the forming method(s), the remaining or bottom layer of pad oxide 509.

In both embodiments, remaining pad oxide 509 becomes a part of the finished HV gate oxide 552 layer. In one embodiment, operation parameters of the pad oxide preclean process and the gate oxide formation process may be configured to achieve the combined thickness of HV gate oxide 552 layer. As previously discussed, the combined thickness of HV gate oxide 552 layer may be greater or less than the desirable or final gate thickness, and excessive HV gate oxide 552 layer may be removed or added in later processes. In one embodiment, since pad oxide 509 and HV gate oxide 552 layer are formed separately and individually, they may be different chemically, in stoichiometric composition and ratio, and/or physically. Moreover, there may be an interface (not shown) between pad oxide 209 and the later grown/deposited HV gate oxide 552 layer in the combined structure.

Next, referring to FIG. 4A and FIG. 5D, dopants are then implanted into substrate 504 through HV gate oxide 552 layer to form wells in which the NVM transistor(s) and/or the I/O and LV_MOS transistors may be formed (step 408). In one embodiment, deep N-well 513 in the first region, N-well and/or P-well 511 in I/O_MOS area 304 and LV_MOS area 306 may be formed concurrently or individually according to process disclosed in step 404, or ordinary skill in the art. In embodiments, channels 519 (not shown in FIG. 5D) of I/O_MOS 314 and/or LV_MOS 316 may also be formed in step 408. In alternative embodiments, some or all of deep N-well 513 in the first region, N-well and/or P-well 511 in I/O_MOS area 304 and LV_MOS area 306 may be formed in step 404 instead.

Figure 5E:
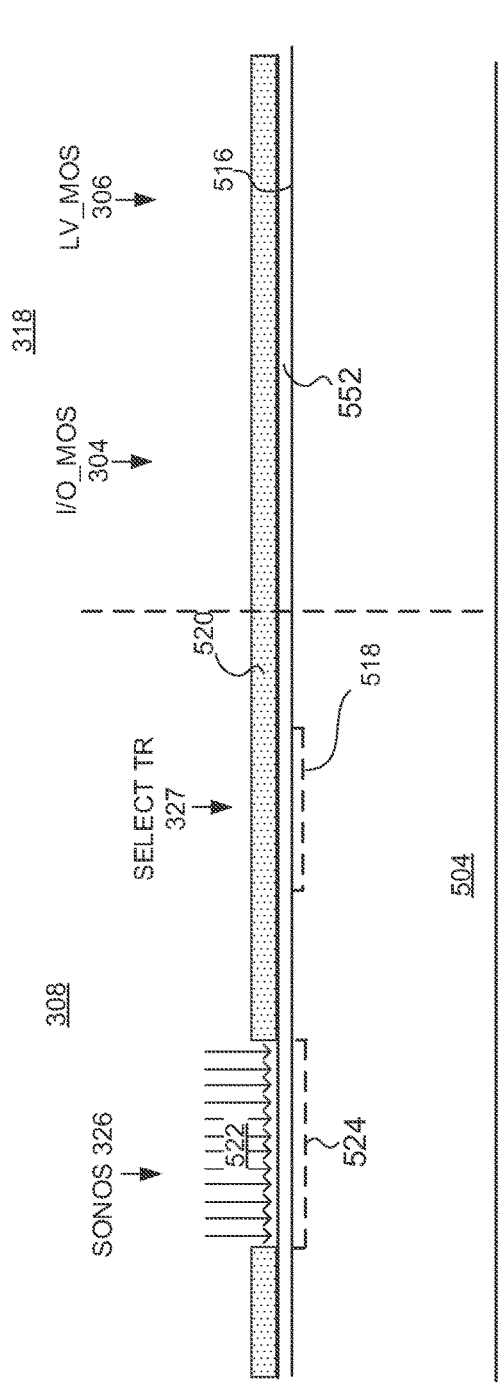
Figure 6A:
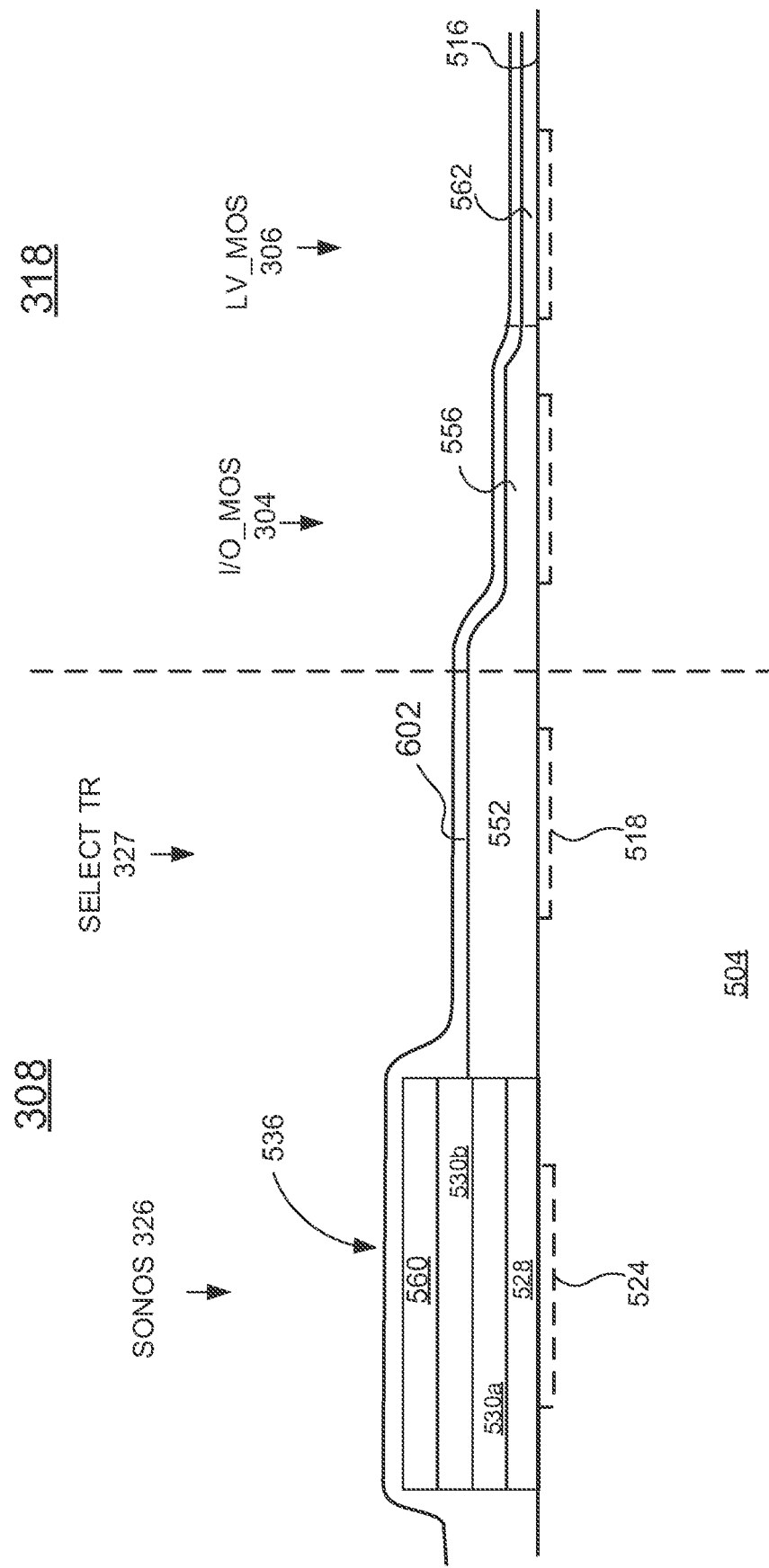

Next, referring to FIG. 4A and FIG. 5E, a patterned tunnel mask 520 is formed on or overlying HV gate oxide 552 layer, ions (represented by arrows 522) of an appropriate, energy and concentration are implanted through a window or opening in tunnel mask 520 to form a channel 524 for NVM or SONOS transistor 326 in first region 308 (step 410). Tunnel mask 520 may include a photoresist layer, or a hard mask formed, from a patterned nitride or silicon-nitride layer. In the embodiment that multiple NVM transistors 326 are present in first region 308, multiple channels 524 may be formed simultaneously or separately.

In one embodiment, channel 524 for NVM transistor 526 may be a deep indium doped channel implanted with indium (In) at an energy of from about 50 kilo-electron volts (keV) to about 500 keV, and a dose of from about 5e11 cm$^{-2}$ to about 1e13 cm$^{-2}$ to form an n-channel NVM transistor 526. In one embodiment, implanting indium to form channel 524 of NVM transistor 526 improves the threshold voltage ($V_T$) uniformity of the finished NVM transistor(s) 526 from a sigma of $V_T$ from about 150 millivolts (mV) to about 70-80 mV. Optionally or additionally, a shallow doped channel is implanted with arsenic at an energy about 20 keV and a dose of from about 5e11 cm$^{-2}$ to about 1e13 cm$^{-2}$ at channel 524. Alternatively, $BF_2$ may be implanted to form an N-channel NVM transistor, or arsenic or phosphorous implanted to form a P-channel NVM transistor. In one alternative embodiment, channel for NVM transistor 526 may also be formed concurrently with channels 519 of the MOS transistors 314, 316. In some embodiments, channel(s) 524 of N-channel NVM transistor(s) and P-channel NVM transistor(s) may be formed simultaneously, or separately.

As previously mentioned, select transistor 327 in the first region 308 and HV_MOS transistor in the second region 318 may have commonly formed HV gate oxide 552 and similar structural features. For the simplicity of illustration, HV_MOS transistor 312 may be omitted in one or more of subsequent figures. It will be the understanding that HV_MOS transistor 312 may be formed in HV_MOS area 302, concurrently or separately, with similar fabrication steps disclosed herein for select transistor 327 in the first region 308.

In one embodiment, HV gate oxide 552 layer in the window or opening in the tunnel mask 520 may be removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. Subsequently or concurrently, tunnel mask 520 includes photoresist material may be ashed or stripped using oxygen plasma. Alternatively, hard tunnel mask 520 may be removed using a wet or dry etch process.

Figure 5F:
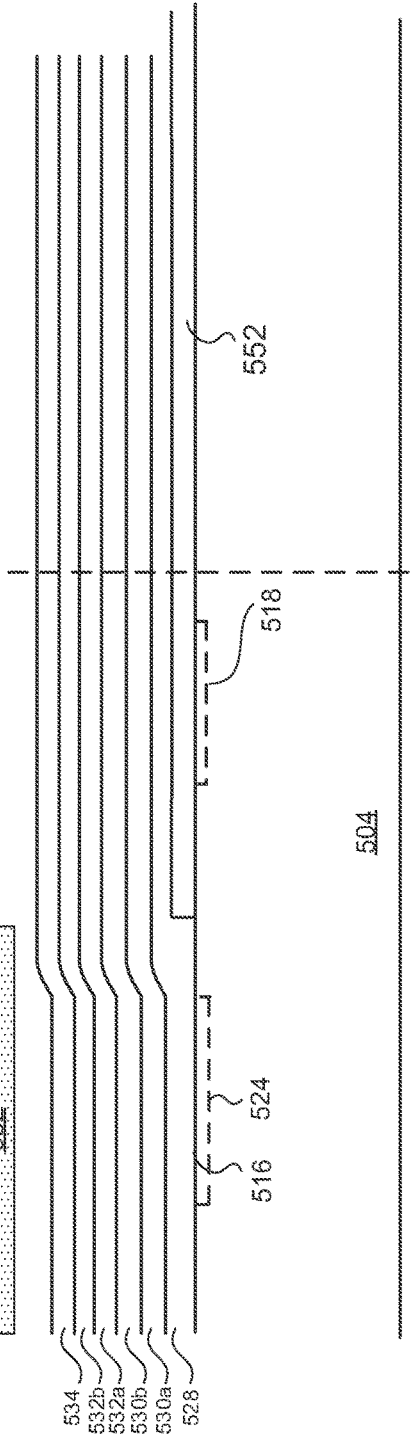

Next, referring to FIG. 4A and FIG. 5F, surface 516 of substrate 504 is cleaned or precleaned, a number of dielectric layers formed or deposited, a mask formed on or overlying the dielectric layers, and the dielectric layers etched to form a NV gate stack 536 in first region 308 (step 412). The preclean may be a wet or dry process. In one embodiment, it may be a wet process using HF or standard cleans (SC1) and (SC2), and is highly selective to the material of substrate 504. In one embodiment, SC1 is typically performed using a 1:1:5 solution of ammonium hydroxide ($NH_4OH$), hydrogen peroxide ($H_2O_2$) and water ($H_2O$) at 30° C. to 80° C. for about 10 minutes. In another embodiment, SC2 is a short immersion in a 1:1:10 solution of HCl, $H_2O_2$ and $H_2O$ at about 30° C. to 80° C.

Referring to FIG. 5F, a number of dielectric layers including tunnel dielectric 528, multi-layer charge-trapping layer 530, multi-layer cap layer 532, sacrificial oxide 534, may be disposed in the first and second regions 308 and 318 (step 412). In one embodiment, tunnel dielectric 528 is formed over HV gate oxide 552 layer in the entire second region 318 and outside of NVM transistor(s) 326 area, such as outside of tunnel mask 520, in the first region 308.

In one embodiment, the dielectric or NV gate stack deposition begins with the formation of tunnel dielectric 528 over at least channel 524 of NVM transistor 526 and channel 518 of select transistor 327 in the first region 308 of substrate 504, and may spread over to second region 318 of substrate 504 where MOS transistors 312 (not shown), 314, 316 are formed. The tunnel dielectric 528 may be any material and have any thickness suitable to allow charge carriers to tunnel into an overlying charge-trapping layer under an applied gate bias while maintaining a suitable barrier to leakage when NVM transistor 526 is unbiased. In some embodiments, tunnel dielectric 528 may be silicon dioxide, silicon oxy-nitride, or a combination thereof and may be grown by a thermal oxidation process, using ISSG or radical oxidation.

In one embodiment a silicon dioxide tunnel dielectric 528 may be thermally grown in a thermal oxidation process. For example, a layer of silicon dioxide may be grown utilizing dry oxidation at 700° C.-800° C. in an oxygen containing gas or atmosphere, such as oxygen ($O_2$) gas. The thermal oxidation process is carried out for a duration approximately in the range of 20 to 150 minutes to effect growth of a tunnel dielectric 528 having a relatively uniform thickness of from about 1.0 nanometers (nm) to about 3.0 nm by oxidation and consumption of the exposed surface of substrate. It will be understood that such a range is merely illustrative and is not meant to be limiting.

In another embodiment, a silicon dioxide tunnel dielectric 528 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1100° C. at a pressure approximately in the range of about 0.5 Torr to about 10 Torr to form radicals, such as, an OH radical, an $HO_2$ radical or an O diradical, at the surface of substrate. The radical oxidation process is carried out for a duration approximately in the approximate range of about 1 to about 10 minutes to effect growth of a tunnel dielectric 528 having a thickness of from about 1.0 nanometers (nm) to about 4.0 nm by oxidation and consumption of the exposed surface of substrate. It will be understood that in FIG. 5F and subsequent figures the thickness of tunnel dielectric 528 may be exaggerated for the purposes of clarity. In one embodiment, tunnel dielectric 528 grown in a radical oxidation process may be both denser and composed of substantially fewer hydrogen atoms per $cm^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 528 without impacting the throughput (substrates/hr.) requirements that a fabrication facility may require.

In another embodiment, tunnel dielectric 528 layer may be deposited by chemical vapor deposition (CVD) or atomic layer deposition (ALD) and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In yet another embodiment, tunnel dielectric 528 may be a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 5F, a charge-trapping layer is formed on or overlying the tunnel dielectric 528. Generally, as best shown in FIG. 2F, the charge-trapping layer may be a multi-layer charge-trapping layer 530 comprising multiple layers including at least a lower or first charge-trapping layer 530a which is physically closer to the tunnel dielectric 528, and an upper or second charge-trapping layer 530b that is oxygen-lean relative to the first charge-trapping layer, and comprises a majority of a charge traps distributed in multi-layer charge-trapping layer 530.

The first charge-trapping layer 530a of multi-layer charge-trapping layer 530 may include a silicon nitride ($Si_3N_4$), silicon-rich silicon nitride or a silicon oxy-nitride ($SiO_xN_y$ (HO)) layer. For example, the first charge-trapping layer 530a may include a silicon oxynitride layer having a thickness of between about 2.0 nm and about 6.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 530b of the multi-layer charge-trapping layer 530 is then formed, either directly or indirectly, over the first charge-trapping layer 530a. In one embodiment, the second charge-trapping layer 530b may include a silicon nitride and silicon oxy-nitride layer having a stoichiometric ratio of oxygen, nitrogen and/or silicon that is different from that of the first charge-trapping layer 530a. The second charge-trapping layer 530b may include a silicon oxynitride layer having a thickness of between about 2.0 nm and about 8.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer. In one alternative embodiment, the stoichiometric composition of oxygen, nitrogen and/or silicon of first and second charge-trapping layers 530a and 530b may be identical or approximately equal to one another.

Figure 5G:
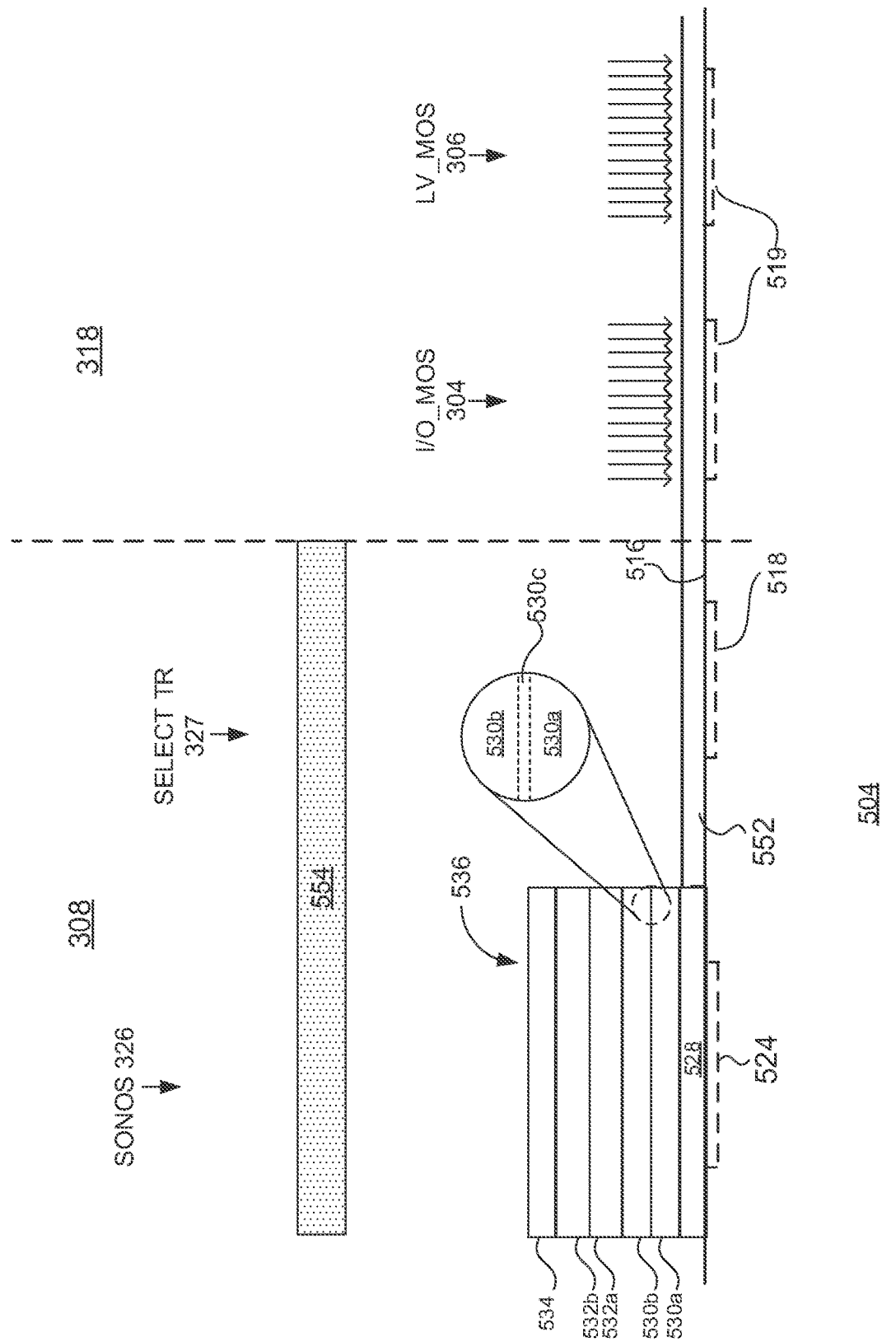

In another embodiment, there may be a thin dielectric and/or oxide layer 530c formed between the first and second charge-trapping layers 530a and 530b as best shown in FIG. 5G, making the multi-layer charge trapping layer 530 an NON stack. In some embodiments, the multi-layer charge-trapping layer 530 is a split charge-trapping layer, further including a thin, middle oxide layer 530c separating the first (lower) and second (upper) charge-trapping layers 530a and 530b. The middle oxide layer 530c substantially reduces the probability of electron charge that accumulates at the boundaries of the second charge-trapping layer 530b during programming from tunneling into the first charge-trapping layer 530a, resulting in lower leakage current than for the conventional memory devices. In one embodiment, the middle oxide layer 230c may be formed by oxidizing to a chosen depth of the first charge-trapping layer 530a using thermal or radical oxidation. Radical oxidation may be performed, for example, at a temperature of 1000-1100° C. using a single substrate tool, or 800-900° C. using a batch reactor tool. A mixture of $H_2$ and $O_2$ gasses may be introduced to a process chamber at a ratio of approximately 1:1 and 10-15 Torr. using a single substrate tool, or a pressure of 300-500 Torr. for a batch process, for a time of 1-2 minutes using a single substrate tool, or 30 min to 1 hour using a batch process. In some embodiments, the radical oxidation process is without an ignition event, such as forming of plasma, which would otherwise typically be used to pyrolyze the $H_2$ and $O_2$ to form steam. Instead, the $H_2$ and $O_2$ is permitted to react at a surface of the first charge-trapping layer 530a to form radicals, such as, an OH radical, an $HO_2$ radical or an O diradical, to form the middle oxide layer 530c.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher weight % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon oxynitride film is therefore more like silicon and the RI is increased toward the 3.5 RI of pure silicon.

Referring again to FIG. 5F, the number of dielectric layers further includes cap layer 532 formed on or overlying charge-trapping layer 530 or second charge-trapping layer 530b. In some embodiments, such as that shown, cap layer 532 is a multi-layer cap layer including at least a lower or first cap layer 532a overlying the charge-trapping layer 530, and a second cap layer 532b overlying the first cap layer 532a.

In one embodiment, first cap layer 532a may include a high-temperature-oxide (HTO), such as silicon oxide (SiO$_2$), having a thickness of between 2.0 nm and 4.0 nm deposited using a low pressure chemical vapor deposition (LPCVD) thermal oxidation process. For example, the oxidation process may include exposing the substrate 504 to a silicon source, such as silane, chlorosilane, or dichlorosilane, and an oxygen-containing gas, such as O$_2$ or N$_2$O in a deposition chamber at a pressure of from about 50 mT to about 1000 mT, for a period of from about 10 minutes to about 120 minutes while maintaining the substrate at a temperature of from about 900° C. to about 1000° C. In some embodiments, the oxidation process is performed in-situ in the same process chamber as used to form second charge-trapping layer 530*b*, and immediately following the formation of second charge-trapping layer 530*b*.

In one embodiment, second cap layer 532*b* may include a silicon nitride, a silicon-rich silicon nitride or a silicon-rich silicon oxynitride layer having a thickness of between 2.0 nm and 4.0 nm formed by a CVD process using N$_2$O/NH$_3$ and DCS/NH$_3$ gas mixtures.

In some embodiments, first and second cap layers 532*a* and 532*b* may both include silicon nitride, a silicon-rich silicon nitride or a silicon-rich silicon oxynitride layer formed by CVD process using N$_2$O/NH$_3$ and DCS/NH$_3$ gas mixtures. First and second cap layers 532*a* and 532*b* may or may not have the same stoichiometry.

Referring still to FIGS. 4A and 5F, a sacrificial oxide layer 534 is formed on or overlying cap layer 532. In one embodiment, sacrificial oxide layer 534 may include a high-temperature-oxide (HTO) layer grown by a thermal oxidation process or radical oxidation, and having a thickness of between 2.0 nm and 4.0 nm. In another embodiment, sacrificial oxide layer 534 may be formed or deposited by a chemical vapor deposition process in a low pressure chemical vapor deposition (LPCVD) chamber. For example, sacrificial oxide layer 534 may be deposited by a CVD process using a process gas including gas mixtures of silane or DCS and an oxygen containing gas, such as O$_2$ or N$_2$O, in ratios and at flow rates tailored to provide a silicon dioxide (SiO$_2$) sacrificial oxide layer 534.

Next, referring to FIG. 4A, FIGS. 5F and 5G, a patterned mask layer 582 is formed on or overlying the sacrificial oxide layer 534, cap layer 532 and charge-trapping layer 530, and tunnel dielectric layer 528 disposed outside of the NVM transistor(s) 326 area in the first region 308 and the entire second region 318 are etched or patterned to form NV gate stack 536. In one embodiment, NV gate stack 536 may be disposed substantially overlying channel 524 of NVM transistor 526 in first region 308. The etching or patterning process may further remove various dielectric layers of NV gate stack 536 from second region 318 of substrate 504 (step 414). In one embodiment, the patterning step may stop at a top surface of HV gate oxide 552 layer, which was already formed at least in the second region 318. The patterned mask layer 280 may include a photoresist layer patterned using standard lithographic techniques, and the NV gate stack 536 layers in first and second region 308 and 318 may be etched or removed using a dry etch process including one or more separate steps to stop on a surface of the tunnel dielectric 528 or previously formed HV gate oxide 552 layer. In one embodiment, the etching may be configured to remove dielectric layers in NV gate stack in STIs 502 (not shown) divot by introducing an isotropic component.

Referring to FIG. 4A and FIG. 5G, dopants are then implanted into substrate 504 through HV gate oxide 552 layer to form channels 519 for the I/O_MOS and LV_MOS transistors (step 416). In one embodiment, channels 519 may be formed by depositing and patterning a mask layer, such as a photoresist layer above the surface 516 of substrate 504, and implanting an appropriate ion species at an appropriate energy to an appropriate concentration. In one embodiment, for example, BF$_2$ may be implanted at an energy of from about 10 kilo-electron volts (keV), to about 100 keV, and a dose of from about 1e12 cm$^{-2}$ to about 1e14 cm$^{-2}$ to form an N-type MOS (NMOS) transistor. A P-type MOS (PMOS) transistor may likewise be formed by implantation of arsenic (As) or phosphorous (P) ions at any suitable dose and energy. It is appreciated that implantation may also be used to form channels 519, in both I/O_MOS and LV_MOS transistors 314 and 316 at the same time, or at separate times using standard lithographic techniques, including a patterned photoresist layer to mask one of the channels 519 for the MOS transistors 314, 316. In another embodiment, channels 519 for I/O_MOS and LV_MOS transistors 314 and 316 may be formed in previous implantation steps 404 or 408.

Figure 5H:
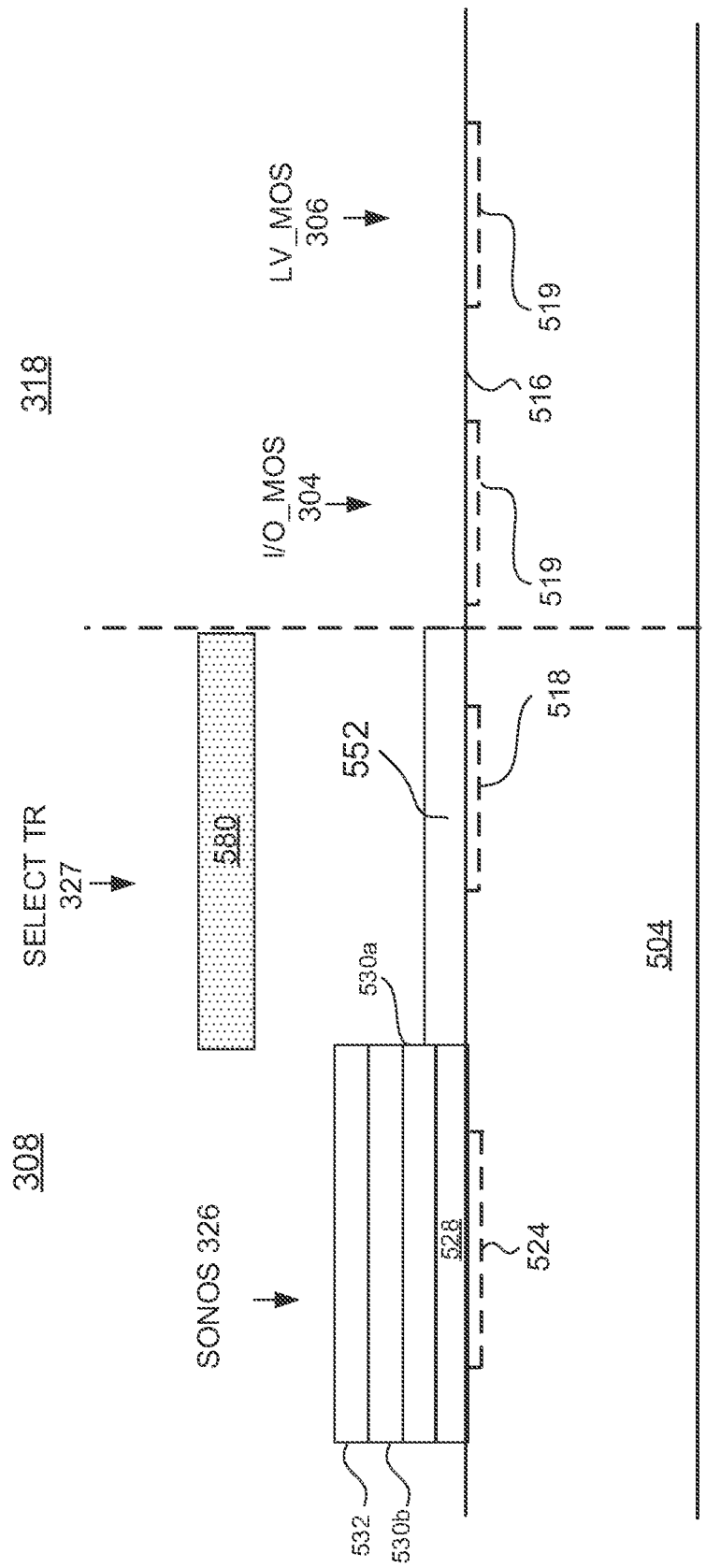

Referring to FIG. 4A and FIGS. 5G and 5H, sacrificial oxide layer 534 and a top portion or substantially all of second cap layer 532*b* in the multi-layer cap layer 532 are removed from NV gate stack 536 in a highly selective cleaning process (step 418). In one exemplary implementation, sacrificial oxide layer 534 and second cap layer 532*b* may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Referring to FIG. 5G, a patterned mask layer 554 may be formed on or overlying at least NV gate stack 536 and select transistor 327 area in the first region 308 and HV gate oxide 552 layer over channel 518 of HV_MOS 312 (not shown in FIG. 5G) in the second region 318 (step 420). The patterned mask layer 554 may include a photoresist layer patterned using standard lithographic techniques, a hard mask layer, or other techniques known in the art.

Next, referring to FIG. 4A and FIG. 5H, HV gate oxide 552 layer overlying at least channels 519 of I/O_MOS 314 and LV_MOS 316 in the second region 318 of substrate 504 is removed (step 420). After the oxide etch step, substrate surface 516 in I/O_MOS area 304 and LV_MOS area 306 may be exposed. In one exemplary embodiment, HV gate oxide 552 layer may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, or any other similar hydrofluoric-based wet etching chemistry. In one alternative embodiment, HV gate oxide 552 layer may be removed using a plasma etch process.

Next, referring to FIGS. 4A and 5I, an oxidation process is performed to oxidize the remaining portion of second cap layer 532*b* and/or the first cap layer 532*a* of multi-layer cap layer 532, and optionally, a portion of second charge-trapping layer 530*b* to form blocking oxide 560 layer overlying second charge-trapping layer 530*b* (step 422). In one embodiment, the oxidation process is adapted to oxidize or consume first cap layer 532*a*, or the remaining portion of second cap layer 532*b*, or optionally a portion of second charge-trapping layer 530*b* to form the blocking oxide 560 layer in the first region while simultaneously oxidizing at least a portion of substrate surface 516 overlaying channels 519 of I/O_MOS 314 and LV_MOS 316 to form I/O gate oxide 556 layer in the second region 318. In one embodiment, a patterned mask layer 580 as best shown in FIG. 5H, may be formed on or overlying at least select transistor 327 area in the first region 308 and HV gate oxide 552 layer over channel 218 of HV_MOS 312 (not shown in FIG. 5G) in the second region 318 to protect the previously formed HV gate oxide 552 layer during the oxidation step of I/O gate oxide 556 layer. In an alternative embodiment, the patterned mask 580 may be omitted and the oxidation process may also grow a layer of oxide at or around channel 518 of select transistor 327 and HV_MOS 312 (not shown) to increase thickness of HV gate oxide 552 layer. The oxidation process may include in-situ-steam-generation (ISSG), or other radical oxidation processes performed in a batch or single substrate processing chamber with or without an ignition event such as plasma. For example, in one embodiment blocking oxide layer 660 and I/O gate oxide 556 layer may be grown in a radical oxidation process involving flowing hydrogen ($H_2$) and oxygen ($O_2$) gas into a processing chamber at a ratio to one another of approximately 1:1, or 10:1 for ISSG, without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 700-800° C., or 800-1100° C. for ISSG, at a pressure approximately in the range of 0.5-5 Torr, or 0.5-15 Torr for ISSG, to form radicals, such as, an OH radical, an $HO_2$ radical or an O diradical radicals at a surface of remaining second cap layer 532$b$ or first cap layer 532$a$. The radical oxidation process may be carried out for a duration approximately in the range of 10-15 minutes to effect growth of blocking oxide 560 layer by oxidation and consumption of the multi-layer cap layer 532 and optionally a portion of the second charge-trapping layer 530$b$ having a thickness of from about 3 nm to about 4.5 nm, and I/O gate oxide 556 layer having a thickness of from about 3 nm to about 7 nm. In one embodiment, by controlling operation parameters in the I/O gate oxide 556 layer formation, targeted thickness of I/O gate oxide 556 layer may be achieved. The parameters may include time duration, temperature, pressure, reactants etc. of the ISSG or other radical oxidation processes. As will be explained in later sections, at least a portion of I/O gate oxide 556 layer remains in the finished device as I/O gate oxide 556 of I/O_MOS transistor 215. In one embodiment, to withstand the relatively high operating voltage, desirable thickness of I/O gate oxide 552 layer may be targeted to be approximately between 30 Å to 70 Å, or other thicknesses. It will be understood that such a range is merely an example and is not meant to be limiting. In one embodiment, I/O gate oxide 556 layer may be formed, in the processes described in FIG. 5I, to be thicker than the desirable thickness. Excessive I/O gate oxide 556 layer may be removed in later processes, to achieve the desirable or final thickness of I/O gate oxide 556 of I/O_MOS transistor 314.

Referring to FIG. 5I again, after I/O gate oxide 556 layer is formed, a patterned mask layer 582 may be formed on or overlying at least NV gate stack 536 and select transistor 327 in the first region 308, HV gate oxide 552 layer over channel 518 of HV_MOS 312 (not shown), and I/O gate oxide 556 layer over channel 519 of I/O_MOS 314 in the second region 318 (step 422). The patterned mask layer 582 may include a photoresist layer patterned using standard lithographic techniques, a hard mask layer or other techniques known in the art.

Next, referring to FIG. 4A and FIG. 5J, I/O gate oxide 556 layer overlying at least channel 519 of LV_MOS 316 in the second region 318 of substrate 504 is removed (step 424). After the oxide etch step, substrate surface 516 in the LV_MOS area 306 may be exposed. In one exemplary embodiment, I/O gate oxide 556 layer may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, or any other similar hydrofluoric-based wet etching chemistry. In one alternative embodiment, I/O gate oxide 556 layer may be etched or removed using a dry etch process including one or more separate steps to stop on substrate surface 516.

Next, referring to FIGS. 4A and 5K, an oxidation process is performed to form LV gate oxide 562 layer (step 426). In one embodiment, LV gate oxide 562 layer may be formed by radical oxidation processes, such as ISSG process, as described above. When LV gate oxide 562 layer is formed by ISSG, a thin LV gate oxide 562 layer, having a thickness from about 5 Å to about 10 Å, may be formed at or around the LV_MOS area 306. The same radical oxidation process may also add thickness to I/O gate oxide 556 layer at or around I/O_MOS area 304, HV gate oxide 552 layer at or around HV_MOS area 302, and blocking oxide 560 layer of NV gate stack 536. In one embodiment, by controlling operation parameters in the LV gate oxide 562 layer formation, targeted thickness of LV gate oxide 562 layer may be achieved. The parameters may include time duration, temperature, pressure, reactants etc. of the ISSG or other radical oxidation processes. As will be explained hereafter, at least a portion of LV gate oxide 562 layer remains in the finished device as LV gate oxide 562 of LV_MOS transistor 316. In an alternative embodiment, a patterned mask (not shown) may be formed overlying the first region 308 and/or HV_MOS area 302 and/or I/O_MOS area 304 during the oxidation process (step 426) of LV gate oxide 562 such that thicknesses of the masked oxide layers therein may not be affected.

In one alternative embodiment, LV gate oxide 562 layer may be formed by RTO or conventional furnace oxidation. In such cases, thicknesses of blocking oxide 560 layer of NV gate stack 536 may not be affected, whether masked or not. In some embodiments a thin high dielectric constant or high-k dielectric material can be used in place of the silicon dioxide. The high-k dielectric material may include, but is not limited to, hafnium oxide, zirconium oxide, hafnium silicate, hafnium oxy-nitride, hafnium zirconium oxide and lanthanum oxide deposited by, for example, atomic layer deposition (ALD), physical vapor deposition (PVD), a chemical vapor deposition (CVD), a low pressure CVD (LPCVD) or a plasma enhanced CVD (PECVD) process.

In some embodiment, forming LV gate oxide 562 layer may also encompass the formation of a nitrogen-rich silicon oxide film by providing a nitridizing atmosphere to substrate 504. The term "nitrogen-rich" may be understood to mean a peak nitrogen concentration of between approximately 0.5 to 3.5 atomic percent (at %) or higher. In addition, the term "nitridizing atmosphere" may be understood to mean an atmosphere that provides for the formation of nitrogen-rich silicon oxide films. In some embodiments providing the nitridizing atmosphere to the substrate 504 may encompass introducing nitrous oxide ($N_2O$) into the torch region at a first temperature. Advantageously, this first temperature may be selected to be sufficiently high to promote an exothermic reaction which forms the nitridizing atmosphere. Subsequently the atmosphere formed is directed to the silicon wafers in the process chamber through the fluidic coupling between the chambers. In one embodiment, nitrogen-rich oxide film may also be formed in I/O gate oxide 256 layer, HV gate oxide 552 layer, and/or blocking oxide 560 layer as they are also exposed to the "nitridizing atmosphere" during step 426. Nitrogen-rich or nitrided silicon oxide films may provide a barrier to diffusion of dopants such as boron, in subsequent fabrication processes. Hence threshold voltage degradation of transistors formed using nitrogen-rich silicon oxide gate dielectrics may be reduced. Additionally, such nitrided silicon oxide films may have improved hot carrier resistance and dielectric integrity.

Figure 5L:
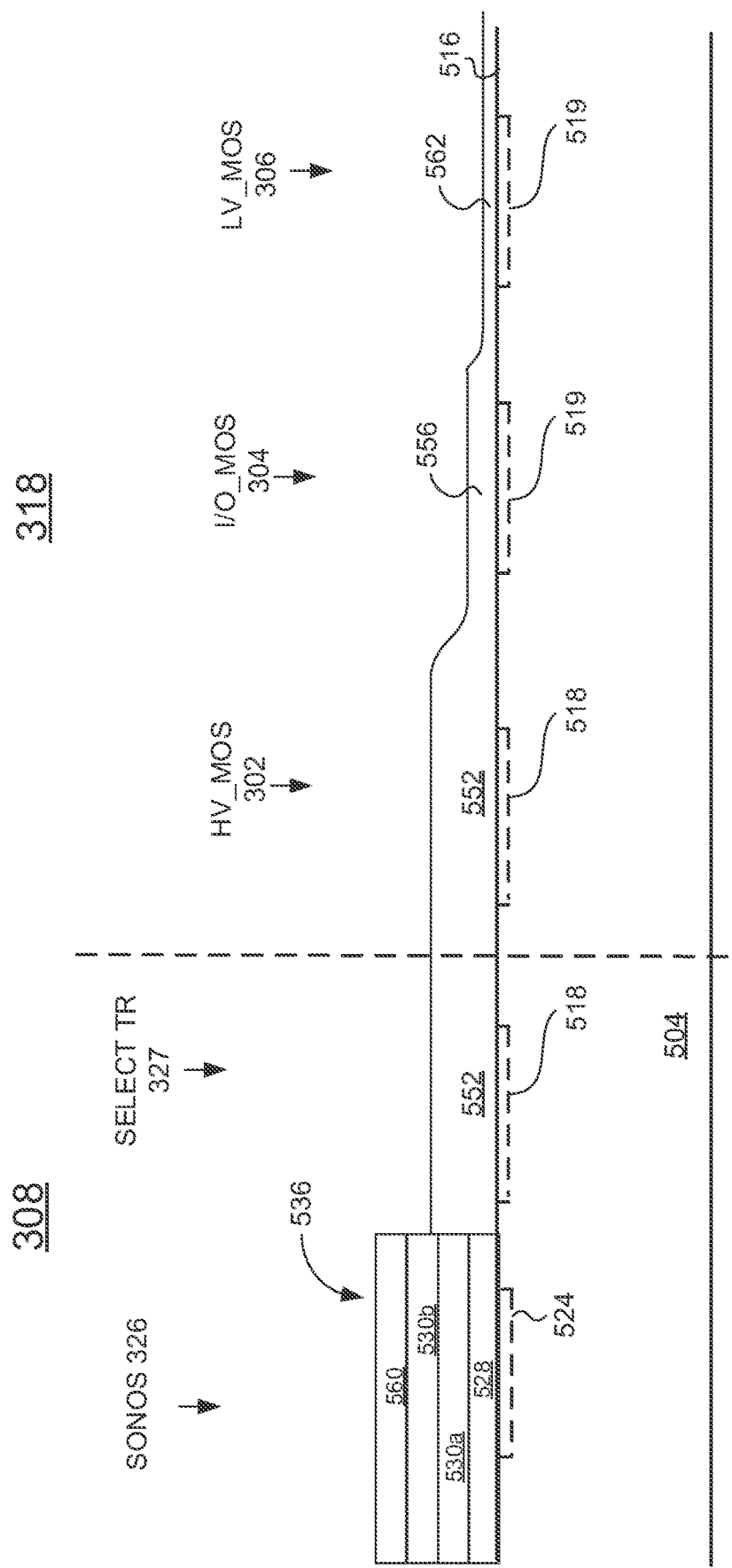

At this stage of fabrication, a triple gate embodiment as best shown in FIG. 5L, in which blocking oxide 560 layer of NVM gate stack 536 and HV gate oxide 552 of select transistor 327 in the first region 308 as well as gate dielectric layers (gate oxide 552, 556, and 562 layers) in HV_MOS area 302, I/O_MOS area 304, and LV_MOS area 306 of the second region 318, each having a distinctively different thickness, are formed. In one embodiment, HV gate oxide 552 of select transistor 327 and HV_MOS transistor 312 is thicker than I/O gate oxide 556, and I/O gate oxide 556 is thicker than LV gate oxide 562. It will be the understanding that, although only one memory cell or transistor device is illustrated in each area in FIG. 5L and other figures, multiple devices such as NVM transistors 326, select transistors 327, HV_MOS transistors 312, I/O_MOS transistors 314, and LV_MOS transistors 316 may be formed concurrently, individually, or in groups according to fabrication process method steps disclosed herein. The fabrication process may progress to high-K dielectric formation and metal gate formation (HKMG process flow) that are described in FIG. 4B.

FIG. 4B is a flowchart illustrating an embodiment of subsequent steps to the embodiments in FIG. 4A for continuing fabrication of a 2T memory cell or array including an embedded SONOS or MONOS based NVM and HV select transistors and HV, I/O, and LV MOS transistors. Among other elements, fabrication steps 428 to 446 describe the formation of high-K dielectric layer and metal gates for NVM transistors 326, select transistors 327 in the first region 308 and/or MOS transistors 312, 314, and 316 of NVM device 600 in FIG. 6K. The embodiments disclosed in FIG. 4A are some of the fabrication methods to yield the embodiment of embedded 2T NVM cells with a triple gate structure (HV, I/O, and LV MOS transistors), as best illustrated in FIG. 5L. It will be the understanding that embodiments disclosed in FIGS. 4B and 6A-6J are applicable to the same or similar structures as illustrated in FIG. 5L, and are not limited to the fabrication methods disclosed in FIGS. 4A and 5A-5K.

Referring to FIG. 4B and FIG. 6A, a high dielectric constant or high-K dielectric material or layer 602 is formed or deposited on or over NV gate stack 536 of NVM transistor 326 and HV gate oxide 552 of select transistor 327, in first region 308 and in second region 318 (step 428). In one embodiment, the deposition step may concurrently form a multilayer blocking dielectric in NVM transistors 326, multilayer gate dielectric in select transistors 327, and MOS transistors 312, 314, and 316. In one embodiment, the multilayer blocking dielectric may include high-K dielectric layer 602 and blocking oxide layer 660 in NVM transistor 326. The multilayer gate dielectric may include high-k dielectric layer 602 and gate oxide 552, 556 and 562 in select transistor 327, HV_MOS transistor 312 (not shown), I/O_MOS transistor 314, and LV_MOS transistor 316, respectively. The high-K dielectric layer 602 may include, but is not limited to, hafnium oxide, zirconium oxide, hafnium silicate, hafnium oxy-nitride, hafnium zirconium oxide and lanthanum oxide deposited to a physical thickness between about 3.0 nm and about 8.0 nm or other thicknesses by, for example, atomic layer deposition (ALD), physical vapor deposition (PVD), a chemical vapor deposition (CVD), a low pressure CVD (LPCVD) or a plasma enhanced CVD (PECVD) process.

It would be the understanding that high-K dielectric layer 602 may increase the overall thickness of multilayer blocking dielectric (blocking oxide 660 layer plus high-K dielectric layer 602) of NVM transistor 326. In some embodiments, the additional thickness, physical and/or electrical, may affect adversely or degrade the performance of NVM transistor 326. In one embodiment, it may be necessary to reduce the thickness of multilayer blocking dielectric to the operational range, for example approximately 3 nm to 4.5 nm. As best illustrated in FIG. 5I and its corresponding description, blocking oxide 560 layer may be primarily formed concurrently with I/O gate oxide 556 of I/O_MOS 304. The operation parameter details of the associated ISSG or radical oxidation process may be difficult to change since I/O gate oxide 556 may require to reach a target thickness of from about 5 nm to about 7 nm or other thicknesses, and it is part of the CMOS baseline process. Instead, in one embodiment, it may be more achievable to adjust the stoichiometry of cap layer 532, especially first cap layer 532a, to suppress or slow down the oxidation rate of cap layer 532 during the ISSG process. In one embodiment, oxygen concentration of first cap layer 532a and possibly second cap layer 532b may be reduced such that the thickness of blocking oxide 560 layer decreases, after the ISSG or radical oxidation process without altering the operation details as described in FIG. 5I. In one embodiment, cap layer 532 may be a pure nitride layer and may contain approximately 0% oxygen. In some optional embodiments, prior to step 428, one or more etching or wet clean processes may be performed on blocking oxide 560 layer, HV gate oxide 552 layer, I/O gate oxide 556 layer, or LV gate oxide 562 layer to achieve respective desired gate dielectric (gate oxide layer plus high-K dielectric layer 602) thickness(es).

In one alternative embodiment, when a polysilicon gate instead of a high-K metal gate is desired, high-K dielectric layer 602 is deposited overlying NV stack 536 of NVM transistor 326, and then removed. MOS transistors, in which high-K metal gate to be formed in first and second regions 308 and 318, may be protected by a patterned mask (not shown in FIG. 6A) during the high-K dielectric layer 602 removal.

Referring to FIG. 4B and FIG. 6B, a polysilicon or poly gate layer 603 is deposited or formed over substantially the entire surface of the substrate 504 or at least in both the first and second regions 308 and 318, and all layers and structures formed thereon (step 430). In one embodiment, polysilicon gate layer 603 may be formed by chemical vapor deposition (CVD) to a thickness of from about 30 nm to about 100 nm, or other appropriate thicknesses. In other embodiments, polysilicon gate layer 603 may be formed by other deposition methods or fabrication methods known in the art. In one alternative embodiment, prior to poly gate layer 603 deposition, a thin layer of titanium nitride (not shown in this figure) is deposited over high-K dielectric layer 602, and poly gate layer 603 may be deposited overlying the thin titanium nitride layer. The titanium nitride deposition is optional, and may facilitate subsequent poly gate layer patterning or removal. In one embodiment, poly gate layer 603 may be deposited conformally.

Referring to FIG. 6B, due to the height difference between NVM gate stack 536 and gate stacks of select transistor 327 and HV_MOS 312 (not shown), there may be step height difference between top surfaces of poly gate layer 603 in NVM transistor 326 area and respectively select transistor 327 area in the first region 308 and HV_MOS area 302 (not shown) in the second region 318. In embodiments, the step height difference may be approximately up to 90 Å or other thicknesses. The step height difference may persist right until a planarization process step 438 as best shown in FIG. 6I, such as an inter level dielectric (ILD) chemical-mechanical polishing (CMP) step. After CMP, the amount of ILD material (e.g. SiN) remaining on top of select gate of select transistor 327 and HV_MOS gate of HV_MOS transistor 302 may be approximately up to 90 Å thicker than that on top of NVM transistor 326. In one embodiment, a possible effect of a pronounced step height difference is that after the full CMP, there may be some residual SiN or ILD material remaining on top of select gate of select transistor 327 and HV_MOS gate of HV_MOS transistor 302. The SiN residue affects a subsequent dummy poly removal step 440 (see FIG. 6J) and hence degrades the filling with the gate metals. In some embodiments, the ILD residue issue may have adverse impact on the yield of the NVM array, especially larger arrays. The step height difference issue may be more pronounced in transistors having thinner gate, such as I/O_MOS transistor 314 and LV_MOS transistor 316.

In one embodiment, additional to the aforementioned benefits of higher P/E voltage operation and improved Vt window and EOL margin, adopting HV transistors, such as HV_MOS transistor 302, having a thick HV gate oxide 552 of approximately 110 Å-160 Å as select transistor 327 may help reduce the step height difference.

Figure 6C:
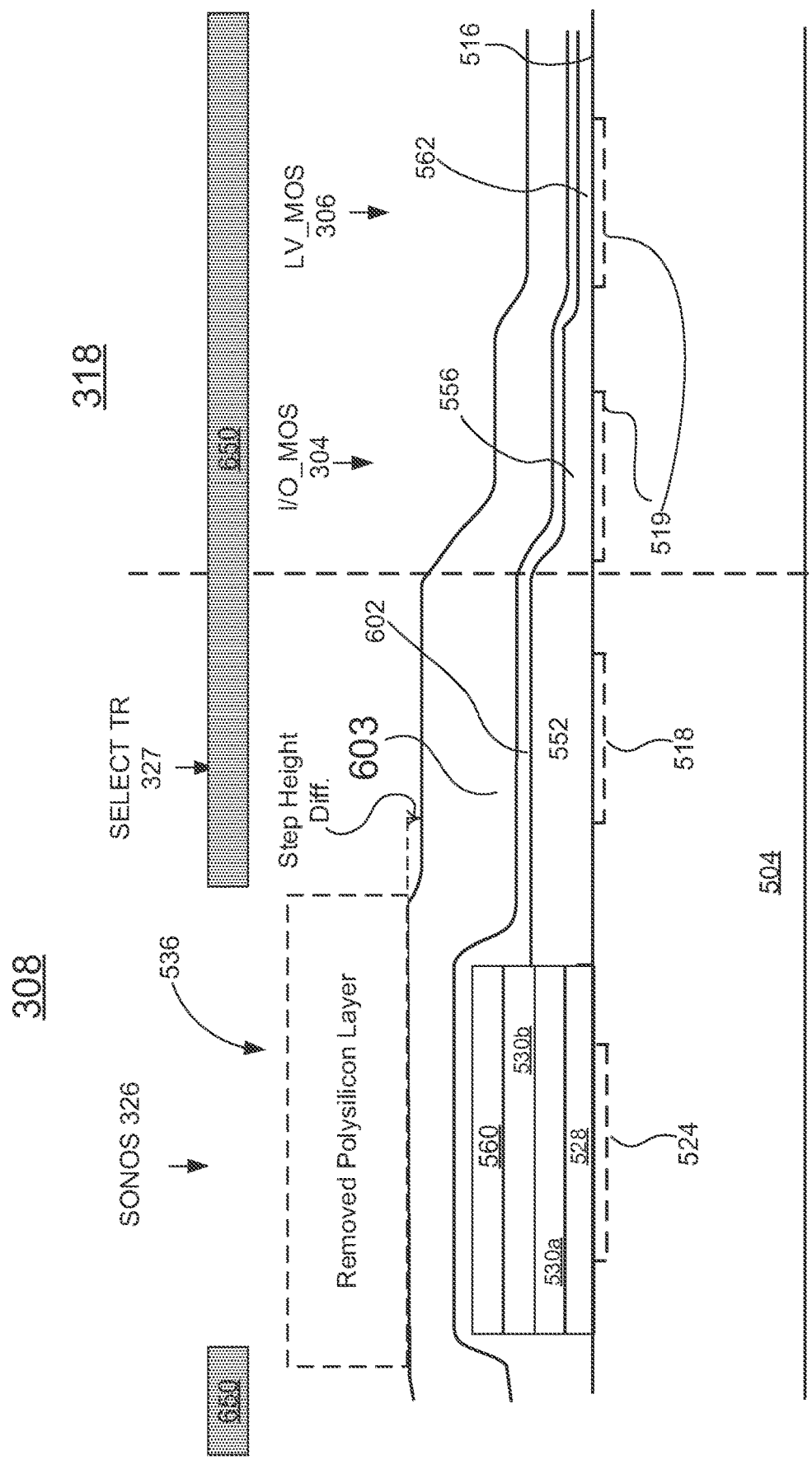

Referring to FIG. 6C, a poly gate layer thin down process is performed in at least the NVM transistor 326 area (step 430). In one embodiment, a patterned mask layer 650 may be formed on or overlying substrate 504. The patterned mask layer 650 may open at least the NVM transistor 326 area in the first region 308 for the subsequent poly gate layer 603 thin down process. The patterned mask layer 650 may include a photoresist layer patterned using standard lithographic techniques, a hard mask layer or other techniques known in the art. In one embodiment, patterned mask layer 650 may be similar or the same as the patterned tunnel mask 520. Poly gate layer 603 in NVM transistor 326 area may be etched down through patterned mask layer 650 such that total gate heights of NVM transistor 326 and select transistor/HV_MOS transistor are closer and step height difference is reduced, minimized, or eliminated. In one embodiment, after the poly gate layer thin down process step, top surfaces of poly gate layer 603 in NVM transistor 326 area, select gate 327 area in the first region 308 and in HV_MOS area 302 in the second region 318 may become approximately coplanar. In other embodiments, patterned mask layer 650 may open the entire first region 308 (including select transistor 327 area) or HV_MOS area 302 (not shown) such that poly gate layer 603 in those region or area may be thinned down. The poly gate layer etch down process may help reduce step height difference among transistors with thicker gates (e.g. NVM transistor 326, select transistor 327, and HV_MOS transistor 312) and thinner gates (e.g. I/O_MOS transistor 314 and LV_MOS transistor 316).

In the aforementioned alternative embodiment that high-K dielectric layer 602 is deposited overlying NV stack 536 of NVM transistor 526 but subsequently removed, polysilicon layer 603 may be deposited on blocking dielectric layer 560 of NVM transistor 526 instead.

Referring to FIGS. 4B and 6D, a patterned photoresist mask or gate mask (not shown) formed using standard lithographic techniques and polysilicon gate layer 603 is etched to stop on surfaces of the high-K dielectric layer 602, thereby forming dummy or sacrificial polysilicon gates 604 of NVM transistor 526, select transistor 327, and MOS transistors 312, 314, and 316 (step 432). In an alternative embodiment, polysilicon gate layer 603 is etched to stop on surfaces of blocking dielectric 560 and MOS gate oxides 552, 556, and 562. In one embodiment, polysilicon gate layer 603 may be etched using standard polysilicon etch chemistries, such as $CHF_3$ or $C_2H_2$ or $HBr/O_2$ which are highly selective to the underlying high-K dielectric layer 602. In one embodiment, multiple dummy polysilicon gates 604 may be formed simultaneously if there are more than one NVM transistors and select transistors in the first region 308 and MOS transistors 312, 314, 316 in the second region 318. In one alternative embodiment, polysilicon gate layer 603 may be etched to stop on surfaces of blocking oxide 560 layer when high-K dielectric layer 602 is not present. In another alternative embodiment, polysilicon gate layer 603 may be etched to stop on surfaces of the aforementioned thin layer of titanium nitride (if present).

Still referring to FIG. 6D, a first spacer layer is deposited and etched to form first sidewall spacers or offset spacers 608 adjacent to dummy or sacrificial polysilicon gates 604 of MOS transistors 312, 314, 316, select transistor 327, and NVM transistor 326 (step 432). In one embodiment, the first spacer layer may include silicon oxide or silicon nitride, deposited to a thickness of from about 5 nm to about 20 nm, using any known CVD technique as described herein.

Subsequently, one or more lightly-doped drain (LDD) extensions may be implanted adjacent to and extend under first sidewall spacers 608 of one or more of select transistor 327, MOS transistors 312, 314, and 316 (step 432). In one embodiment, MOS LDDs are formed by implanting an appropriate ion species at an appropriate energy to an appropriate concentration. For example, drain extensions of P-type LV_MOS transistor 316, or any other P-type MOS transistors may be formed by forming a photoresist mask through which selected transistors are exposed and implanting boron ions ($BF_2$) at an energy of from about 10 to about 100 kilo-electron volts (keV), and a dose of from about 1e12 $cm^{-2}$ to about 5e14 $cm^{-2}$ through the photoresist mask (not shown). Optionally, pocket or halo implants (not shown) for P-type LV_MOS transistor 316 or other P-type MOS transistors may be done through the same photoresist mask, by implanting Arsenic or Phosphorus at energy of 20 to 70 kilo-electron volts (KeV) and a dose of 2e12 $cm^{-2}$ to about 5e12 $cm^{-2}$. Similarly, MOS LDDs of N-type transistors, such as N-type I/O_MOS transistor 215 and select/HV_MOS transistors 327 and 312 may be formed by implanting arsenic or phosphorus at energy of from about 10 to about 100 kilo-electron volts (keV), and a dose of from about 1e12 $m^{-2}$ to about 5e14 $cm^{-2}$, also through an appropriately patterned photoresist mask. Halo or pocket implants for the N-type MOS transistors may also be done through this mask using Boron ($BF_2$) at energy of 5 to about 50 kilo-electron volts and a dose of 1e12 $cm^{-2}$ to 5e12 $cm^{-2}$.

Referring to FIG. 6E, as previously described, polysilicon gate etch (step 432) may be stopped at high-K dielectric layer 602 or blocking oxide 560. As best illustrated in FIG. 6D, there may be residual high-K dielectric layer 602 overlying the substrate, and the removal of ONO and high-K dielectric layer 602 especially from source/drain regions of NVM transistor(s) 326 and/or select transistor 327 is necessary. After ONO deposition and patterning (steps 412 and 414), ONO layers are removed from the second region 318. However, there may be ONO layers remaining in the first region 308, especially between NVM transistors 326 and select transistors 327. After high-K dielectric layer 602 deposition (step 428), polysilicon gate layer 603 deposition (step 430) and dummy polysilicon gate 604 patterning (step 432), there may still be high-K dielectric and ONO materials remaining at least in the source/drain areas of NVM transistors 326. In one embodiment, these remaining films in between NVM transistors 326 need to be removed so that the low energy NVM LDD implants (in subsequent step 434) may reach the required depths. Otherwise, in some embodiments, the junctions may be too shallow with insufficient doping which may degrade NVM transistor 326 performance.

In one embodiment, remaining high-K dielectric layer 602 and ONO films in at least the first region 308 may be removed using the same photoresist mask (not shown) that is used for the NVM LDD implants 611 in subsequent step 434. As best shown in FIGS. 6E and 6F, after first spacers 608 are formed by depositing and etching of spacer layer, the NVM LDD mask is set up and used to open NVM transistors 326 to implants. Before NVM LDD implants process, dry or wet etch may be done to remove remaining high-K dielectric layer 602 and remaining ONO film. The etch may stop at the tunnel oxide 528 of NVM transistors 226, or all the way to the substrate surface 516. In some embodiments, the dry or wet etch may also be used to remove any remaining high-K dielectric layer 602 or ONO film beyond NVM transistors 326 in the second region 318.

In one embodiment, NVM LDD mask (not shown) formed over the substrate 504, lightly-doped drain extensions 611 are implanted, adjacent to the NVM transistor 326, SONOS pocket or halo implants extending partially into the channel region 524 under the gate stack 536 of NVM transistor 326 implanted. The NVM LDD implants 611 and first sidewall spacers 608 for NVM transistor 326 may be formed using techniques substantially the same as those described above with respect to the MOS LDD implants and first sidewall spacers 608. For example, in one embodiment, NVM LDD implants 611 may be formed by an angled implant of, for example, arsenic or phosphorous at an energy of from about 5 to about 25 kilo-electron volts (keV), and a dose of from about 5e12 cm$^{-2}$ to about 2e14 cm$^{-2}$. Optionally, pocket or halo implants may be formed by implanting (BF$_2$) with energy of 10 to 30 kilo-electron volts and a dose of 1e12 cm$^{-2}$ to 3e12 cm$^{-2}$.

Referring to FIG. 4B and FIG. 6G, second spacer layer is deposited and etched to form second sidewall spacers 610 adjacent to first sidewall spacers 608, of the NVM transistor 326, select transistor 327, and MOS transistors 312, 314, and 316 (step 436).

Next, source and drain implants are performed to form source and drain regions 630 for all transistors and a silicide process performed (step 436). In one embodiment, a hard mask (HM) may be formed and patterned to expose only the S/D regions of P-type transistors, such as P-type LV_MOS 316, a silicon-germanium (SiGe) layer 613 may be deposited and etched, and the hard mask removed to form a strain inducing layer over the S/D regions of P-type LV_MOS 316, or other P-type transistors in first and second regions. As depicted, silicide regions 612 may be formed on exposed source and drain regions 630. Optionally, silicide regions 612 may also be formed over one or more dummy polysilicon gate 604 in the first and second regions 308 and 318. In one embodiment, silicide regions 612 may not be formed between NVM transistor 326 and select transistor 327. The silicide process may be any process commonly employed in the art, typically including a pre-clean etch, cobalt or nickel metal deposition, anneal, and wet strip. In one embodiment, rapid thermal annealing (RTA) may be performed on S/D regions before silicide formation process. In one embodiment, prior to the silicide process, a cleaning process may be performed to remove any remaining tunnel oxide layer 528 and/or pad oxide layer 509 on substrate surface 516 beyond the formed transistors in the first and second regions 308 and 318.

Figure 6H:
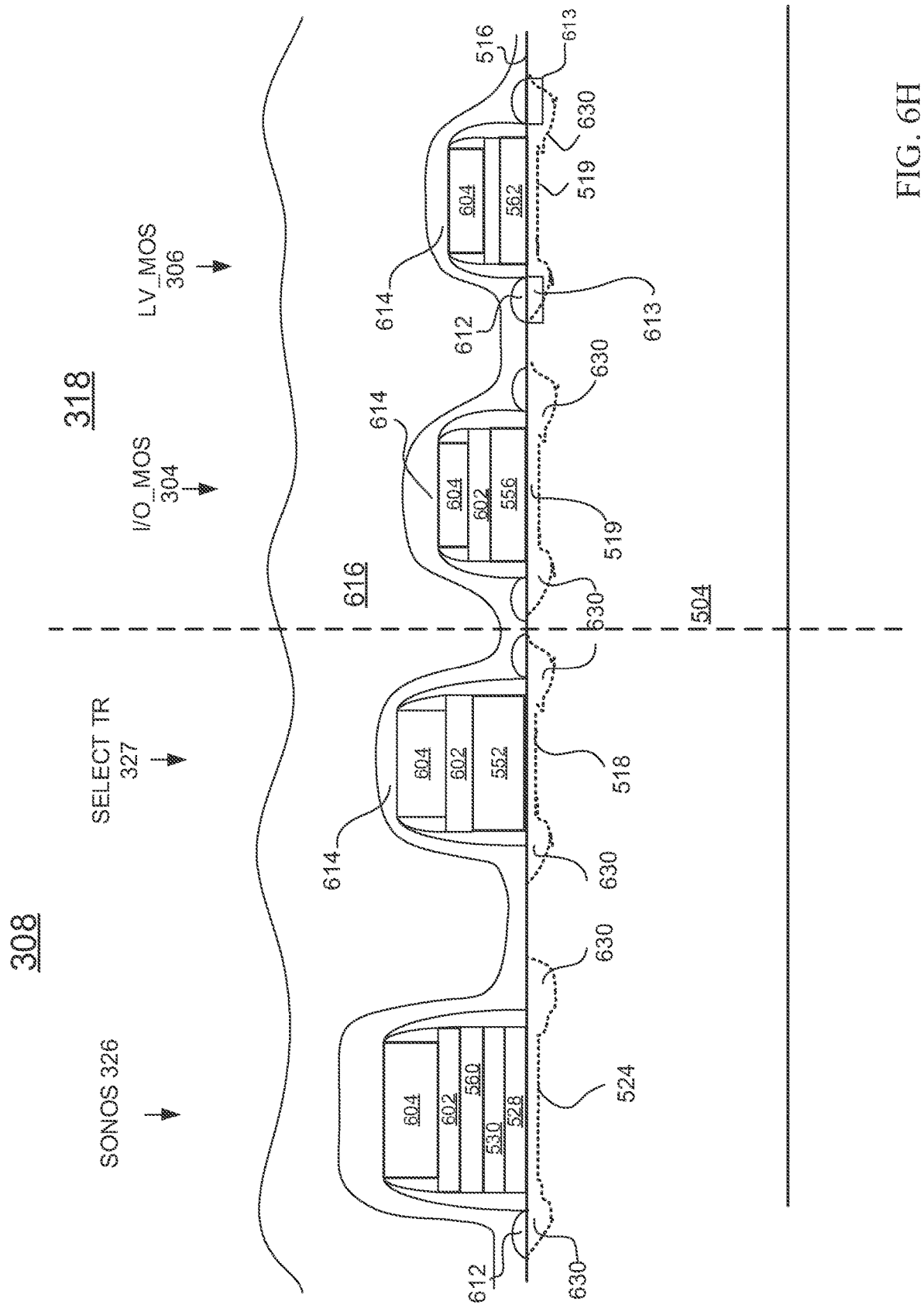
Figure 6I:
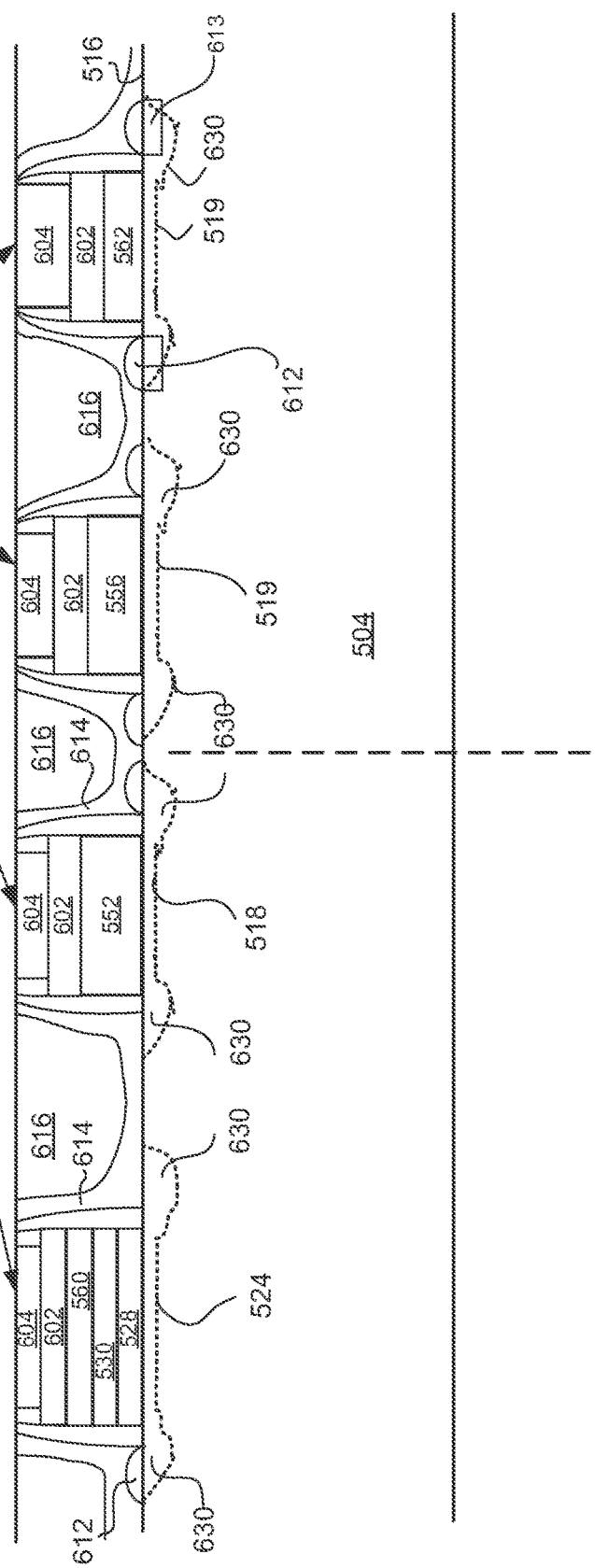

Referring to FIGS. 4A and 6H, the method further includes forming a stress inducing liner or layer 614, such as a stress inducing nitride layer, and depositing an interlevel dielectric (ILD) layer 616 over substantially the entire surface 516 of substrate 504 and all layers and structures formed thereon, and the ILD layer 616 planarized, for example, using a chemical-mechanical polishing (CMP) process (step 438). The stress inducing layer 614 may include, a compressive or tensile nitride layer formed using a plasma enhanced chemical vapor deposition (PECVD) or a Bis-TertiaryButylAmino Silane (BTBAS) nitride layer, deposited or grown to a thickness of from about 30 nm to about 70 nm or other thicknesses, using any known technique including chemical vapor deposition. The ILD layer 616 may include, for example, silicon nitride or silicon oxide, deposited or grown to a thickness of from about 0.5 μm to about 1.0 μm or other thicknesses, using any known CVD technique as described above.

Next, referring to FIG. 6I, a chemical mechanical planarization (CMP) process may be performed to expose dummy polysilicon gates 604 in NVM transistor 326 and select transistor 327 in the first region 308, and MOS transistors 312 (not shown), 314, and 316 in the second region 318. As best illustrated in FIG. 6I, a single CMP process is performed to expose all targeted dummy polysilicon gates 604. As previously explained, gate height of various transistors, e.g. NVM 326, select 327, and HV_MOS 312, or I/O_MOS 314 and LV_MOS 316 may be made closer after the poly gate layer etch down process step 430, as best shown in FIG. 6C. Therefore, ILD material and SiN residue issues and their corresponding effects may be reduced or minimized during the CMP process step. Due to the possible difference in gate heights, different transistors may have different thicknesses of remaining dummy poly gates 604 after the CMP process step. In another embodiment, due to the potential difference in total gate heights of various transistors, multiple CMP processes may be employed such that all targeted dummy polysilicon gates 604 are exposed.

Figure 6J:
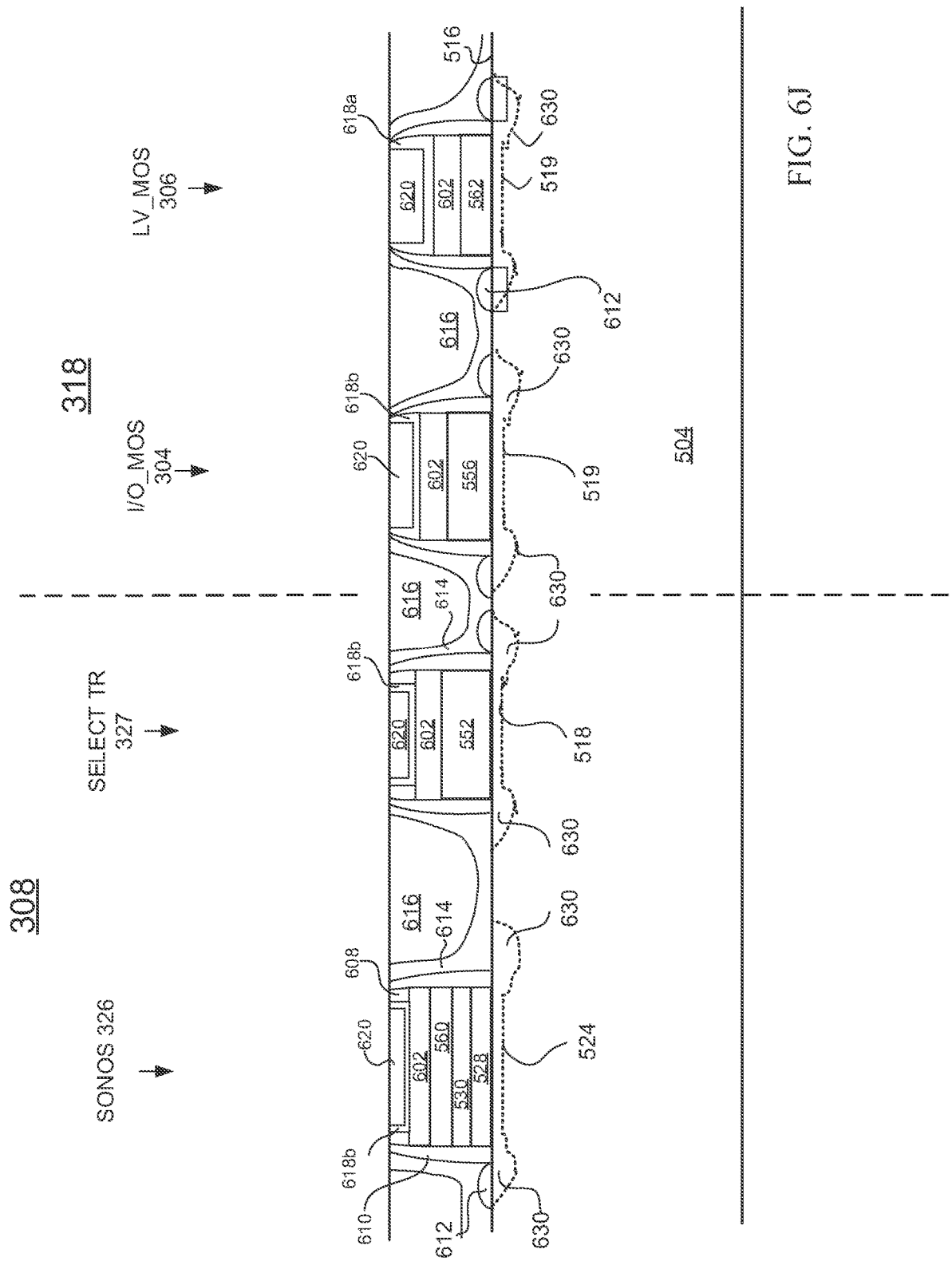

Referring to FIGS. 1 and 6J, dummy polysilicon gates 604 are removed (step 440). In one embodiment, dummy polysilicon gates 604 may be removed using standard polysilicon etch chemistries, such as CHF3 or C2H2 or HBr/O2 and methods that are known in the art, which are highly selective to the material of high-K dielectric layer 602, ILD layer 616, stress inducing liner 614, first and second sidewall spacers 608 and 610. In an alternative embodiment, one or more dummy polysilicon gate 604 in NVM transistor 326, select transistor 327 and/or MOS transistors 312, 314, and 316 may not be removed, in cases wherein a polysilicon gate is preferred over a metal gate. In the embodiment wherein the thin titanium nitride is present, the polysilicon etch may stop at the thin titanium nitride layer (not shown) instead.

Still referring to FIG. 6J, metal layers 618 of multi-layer metal gates are formed, (step 442). In one embodiment, the multi-layer metal gates may replace the removed dummy polysilicon gates 604. In one embodiment, first or P+ metal layer 618a (high work function metal) is deposited over substantially the entire surface of the substrate 504 and all layers and structures formed thereon, a patterned photoresist mask (not shown) formed using standard lithographic techniques and the P+ metal layer etched to remove first or P+ metal layer from N-type NVM transistor(s) 326 and select transistor(s) 327 in the first region 308 and N-type MOS transistors 312, 314, 316 in the second region 318, stop on surfaces of the high-K dielectric layer 602, thereby forming high work function gate 618a for any P-type NVM transistor(s) and P-type MOS transistor(s), such as P-type LV_MOS transistor 316 in FIG. 6K. The P+ metal layer 618a may include aluminum, titanium or compounds or alloys thereof, deposited to a thickness of from about 20 nm to about 100 nm or other thicknesses, using physical or chemical vapor deposition. In one embodiment, P+ metal layer 618a may be formed overlying high-K dielectric layers 602, and optionally on sidewalls, of the openings previously occupied by dummy polysilicon gates 604. P+ metal layer 618a formed over N-type MOS transistors may then be removed. Next, second or N+ metal layer 618b (low work function) is deposited over substantially the entire surface of the substrate 504, including the previously formed P+ metal layer 618a, such as around P-type LV_MOS 316. A patterned photoresist mask (not shown) is then formed and the N+ metal layer 618b etched to form a non-high or low work function metal gate 618b for any N-type transistors in the first and second regions 308 and 318, such as N-type NVM transistor 326, select transistor 327, HV_MOS transistor 312 (not shown), and I/O_MOS transistor 316 as best shown in FIG. 6K. In one embodiment, N+ metal layer 618b may be formed overlying high-K dielectric layers 602, and optionally on sidewalls, of the openings previously occupied by dummy polysilicon gates 604. The N+ metal layer 618b may include titanium, lanthanum, aluminum, or compounds or alloys thereof, deposited to a thickness of from about 20 nm to about 100 nm or other thicknesses, using physical or chemical vapor deposition. In general, any N-type transistor may include a low work function metal layer, such as N+ metal layer 618b, and any P-type transistor may include a high work function metal layer, such as P+ metal layer 618a, overlying their respective high-K dielectric layers 602. In one alternative embodiment, N-type NVM transistor 326 may include high work function metal layer, such as P+ metal layer 618a instead. The incorporation of the high work function metal layer in N-type NVM transistor 326 may provide improved erase performance to the device as it may avoid erase saturation. In the embodiment wherein the thin titanium nitride layer is present, P+ or N+ metal layer 618a or 618b may be deposited overlying the thin titanium nitride layer. Since the titanium nitride layer is very thin, it may not affect the property of the finished metal gates significantly. In other embodiments, the sequence of forming and patterning of P+ metal layer 618a and N+ metal layer 618b may be reversed. In one alternative embodiment, prior to forming of P+ or N+ metal layer 618a or 618b, a layer of tantalum nitride is deposited overlying the thin layer of titanium nitride (if present). The thin layer of titanium nitride and tantalum nitride will form a bottom barrier metal layer. As discussed, the bottom barrier metal layer disposed between P+ or N+ metal layer 618a or 618b and high-K dielectric layer 602 is optional.

Still referring to FIG. 6J, thick gate metal layer is deposited, etched and may be followed by planarization using a CMP process or multiple CMP processes to form thick metal gates 620, completing the formation of multilayer metal gates for the NVM transistor 326, select transistor 327, and all of the MOS transistors 312, 314, and 316 (step 442). In one embodiment, thick gate metal layer may include a conformal layer of aluminum, titanium, titanium-nitride, tungsten or compounds or alloys thereof, overlying its respective P+ metal layer 618a or N+ metal layer 618b. Thick gate metal layer 620 may be deposited to a thickness of from about 0.1 μm to about 0.5 μm or other thicknesses, using physical or chemical vapor deposition, or other deposition methods known in the art. In one embodiment, NVM transistor 326, may also be referred to as Metal-Oxide-Nitride-Oxide-Semiconductor (MONOS) transistor because of the presence of multilayer metal gate (first or second metal layer 618a or 618b and thick gate metal layer 620). It will be the understanding that NVM, SONOS and MONOS are used interchangeably throughout the entire patent document. Optionally, a metal polish process may be applied to level out or planarize the top surfaces of thick gate metal layer 620 of NVM transistor 326, select transistor 327, and MOS transistors 312, 314, and 316 (step 445). In one alternative embodiment, prior to forming of thick gate metal layer 620, a top barrier metal layer (not shown in this figure) including titanium nitride and titanium, may be formed overlying P+ or N+ metal layer 618a or 618b. In one embodiment, the top barrier metal layer is optional.

Next, the standard or baseline CMOS process flow is continued to substantially complete the front end device fabrication (step 446), yielding the structure shown in FIG. 6K. In one embodiment, a second ILD layer 622 may be deposited and contacts (not shown) formed to the source/drain regions and gates for the NVM transistor 326, select transistor 327, and all of the MOS transistors 312, 314, and 316. The second ILD layer 622 may include, for example, silicon oxide or silicon nitride, deposited or grown to a thickness of from about 0.5 μm to about 1 μm or other thicknesses, using any known CVD as described above. The contacts (not shown) may be formed by forming a patterned photoresist mask over second ILD layer 616, etching the second ILD layer 622 using any of the standard oxide etch processes as described above to stop on the silicide 612. Optionally, second ILD layer 622 may be a stress inducing layer or structure, such as a stress inducing nitride layer, over NVM transistor 326 to increase data retention and/or to improve programming time and efficiency. In particular, inducing stress into the charge-trapping layer 530 of the NVM transistor 326 changes energy levels of charge traps formed therein, thereby increasing charge retention of the charge-trapping layer. In addition, forming a stress inducing structure 622, in or on the surface 516 of the substrate 504 proximal to, and preferably surrounding, a region of the substrate in which the channel 524 of NVM transistor 326 is formed will reduce the band gap, and, depending on the type of strain, increases carrier mobility. For example, tensile strain, in which inter-atomic distances in the crystal lattice of the substrate 504 are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in faster and more efficient programming of NVM transistor 326.

The strain inducing structure 622 may include a pre-metal dielectric (PMD) layer formed using a High Aspect Ratio Process (HARP™) oxidation process, a compressive or tensile nitride layer formed using a plasma enhanced chemical vapor deposition (PECVD) or a Bis-Tertiary Butyl Amino Silane (BTBAS) nitride layer.

In certain embodiments, such as that shown in FIG. 6K, the stress inducing structure 622 may also be formed over one or more of the select transistor, MOS transistor (HV, I/O, or LV_MOS) to induce strain in the channel(s) 518 and 519 of the select and MOS transistor(s) 327, 312, 314, 316.

FIG. 6K is a block diagram illustrating a cross-sectional view of a portion of a finished NVM device 600 including an embedded SONOS or MONOS based 2T memory cell and MOS transistors fabricated according to the method of FIGS. 4A to 6J. In one embodiment, NVM device 600 may be similar to NVM device 300 in FIG. 3, having a memory region 308 and logic region 318. As best illustrated in FIG. 6K, NVM device 600 is shown to have at least one 2T memory cell including N-type NVM transistor 326 and select transistor 327 formed adjacent to one another in the memory region 308; and one N-type HV_MOS transistor 312, one N-type I/O_MOS transistor 314, and one P-type LV_MOS transistor 316 in the CMOS region 318. It will be the understanding that NVM device 600 may resemble NVM device 300 in FIG. 3 and may have multiple memory and/or CMOS regions 308 and 318 and in each region there may be multiple NVM transistors 326, select transistors 327, and MOS transistors 312, 314, and 316 of both P-type and N-type, and the figures are for illustrative purposes, and should not be interpreted as a limitation. It will be the understanding that multiple different types of transistors shown in FIG. 6K may be fabricated according to the method of FIGS. 4A to 6J concurrently, individually, or in groups.

FIG. 6K illustrates a portion of the completed embedded SONOS or MONOS based NVM device 600 including one or more MONOS transistor or NVM transistor 326, select transistor 327, HV_MOS transistor 312, I/O_MOS transistor 314, and LV_MOS transistor 316, all formed within a single semiconductor die or a single substrate 504. In one embodiment, multiple layer blocking dielectric (blocking oxide 560 and high-K dielectric layer 602) may include a thickness of from about 40 Å-45 Å.

In one embodiment, select transistor 327 (in memory region 308) and HV_MOS 312 (in CMOS region 318) may have similar or the same structural features and formed concurrently or individually using the same process flow as previously disclosed. Both types of transistors, in their respective function as a select gate in a 2T memory cell or in high voltage operations, may require a relatively thick HV gate dielectric layer (HV gate oxide 552 plus high-K dielectric layer 602) that may have a combined thickness of from about 110 Å-160 Å. As discussed earlier, HV gate oxide 552 plus high-K dielectric layer 602 must be thick enough to withstand high operation voltages, especially during programming and erasing of NVM transistor 326, which may be in a range of 4.5 V-12 V. In one embodiment, I/O gate dielectric layer (I/O gate oxide 256 plus high-K dielectric layer 602) may include a thickness of about 30 Å-70 Å, to operate potentially of I/O voltages in a range of 1.6 V-3.6 V. In one embodiment, LV gate dielectric layer (LV gate oxide 562 plus high-K dielectric layer 602) may have a combined thickness of from about 18 Å-26 Å for various core operations in an operation range of 0.8 V-1.4 V. In general, HV gate dielectric layer is thicker than I/O gate dielectric layer, and I/O gate dielectric layer is thicker than LV gate dielectric layer. In one embodiment, despite the difference in gate oxide/dielectric thickness, finished NVM transistor 326, select transistor 327, HV_MOS transistor 312, I/O_MOS transistor 314, and LV_MOS transistor 316 may have an approximate same heights due to the CMP process step.

In one embodiment, nitrogen-rich oxide film (not shown in FIG. 6K) may also be formed in LV gate oxide 562, I/O gate oxide 556, HV gate oxide 552, and/or blocking dielectric 560 as they may be exposed to the "nitridizing atmosphere" during the LV gate oxide formation (step 426). The nitrogen-rich oxide film may be disposed close to substrate surface 516, or the bottom of blocking dielectric 560.

In one embodiment, multilayer metal gates (first or second gate metal layer 618a or 618b and thick gate metal layer 620) may be included in some or all NVM transistors 326, select transistor 327 and MOS transistors 312, 314, and 316. In alternative embodiments, at least one of NVM transistor 326, select transistor 327 and MOS transistors 312, 314, and 316 may include a polysilicon gate instead. In one embodiment, polysilicon gates may be achieved when dummy polysilicon gates 604 are not etched out and replaced by multilayer metal gates 618 and 620.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method for fabrication of a memory device, comprising:
forming a first gate oxide layer overlying first and second regions of a substrate;
removing a first portion of the first gate oxide layer to create a first opening in the first region;
forming a dielectric stack in the first opening and overlying the first gate oxide layer;
patterning the dielectric stack to form a non-volatile (NV) gate stack in the first region;
removing the first gate oxide layer from second and third areas of the second region;
forming a second gate oxide layer in the second area and a third gate oxide layer in the third area of the second region;
forming a high dielectric constant (high-K) dielectric layer and a dummy polysilicon gate layer overlying the dielectric stack and the first gate oxide layer in the first region and the first, second, and third gate oxide layers in the second region;
etching down the dummy polysilicon gate layer overlying the NV gate stack;
patterning the dummy polysilicon gate and high-K dielectric layers, and respectively the NV gate stack and the first gate oxide layer to form a non-volatile memory (NVM) transistor and a select transistor in the first region;

replacing the dummy polysilicon gate layer in the NVM and select transistors with a metal layer; and patterning the first gate oxide, dummy polysilicon gate and high-K dielectric layers to form a high voltage (HV) metal-oxide-silicon (MOS) transistor in a first area of the second region, wherein the select transistor in the first region and the HV MOS transistor in the second region are formed concurrently.

2. The method of claim 1, further comprising:

patterning the second gate oxide, dummy polysilicon gate and high-K dielectric layers to form an input/output (I/O) MOS transistor in the second area of the second region; and patterning the third gate oxide, dummy polysilicon gate, and high-K dielectric layers to form a low voltage (LV) MOS transistor in the third area of the second region.

3. The method of claim 1, wherein the first gate oxide layer is formed to have greater thickness than the second gate oxide layer, and the second gate oxide layer is formed to have greater thickness than the third gate oxide layer.

4. The method of claim 1, wherein forming the second gate oxide layer in the second area further comprises:

performing a radical oxidation to concurrently form the second oxide layer and oxidize a top portion of the NV gate stack to form a blocking oxide layer.

5. The method of claim 1, further comprising:

forming a patterned mask exposing the dummy polysilicon gate layer overlying the NV gate stack; and performing a polysilicon etch process to thin down the dummy polysilicon gate layer above the NV gate stack such that top surfaces of the dummy polysilicon gate layer above the NV gate stack in the first region and above the first gate oxide layer in the first and second regions are approximately coplanar.

6. The method of claim 1, further comprising:

forming a patterned mask such that the dummy polysilicon gate layer overlying the NV gate stack in the first region and the first gate oxide layer in the first and second regions is exposed; and performing a polysilicon etch process through the patterned mask to thin down the dummy polysilicon gate layer such that top surfaces of the dummy polysilicon gate layer above the NV gate stack, the first gate oxide layer in the first and second regions, and the second and third gate oxide layer in the second region are approximately coplanar.

7. The method of claim 1, further comprising:

forming a stress inducing silicon nitride layer and an interlevel dielectric layer (ILD) overlying the substrate; and performing a chemical-mechanical polishing (CMP) process until at least one of the dummy polysilicon gate layers of the NVM transistor and the select transistor in the first region is exposed.

8. The method of claim 1, wherein replacing the dummy polysilicon gate layer further includes:

performing a polysilicon etch to remove the dummy polysilicon gate layer in the NVM transistor and the select transistor, wherein the NVM and select transistors form a two-transistor memory cell in the first region;

depositing a first metal gate layer overlying the high-K dielectric layer in the NVM transistor and the select transistor; and depositing a second metal gate layer overlying the first metal gate layer.

9. The method of claim 8, wherein the NVM and select transistor are of n-channel type, and wherein:

the first metal gate layer in the NVM transistor includes high work function metal, wherein the high work function metal includes at least one of aluminum, titanium, and compounds or alloys thereof; and the first metal gate layer in the select transistor includes low work function metal, wherein the low work function metal includes at least one of titanium, lanthanum, aluminum, and compounds or alloys thereof.

10. The method of claim 2, wherein the first gate dielectric in the select and HV MOS transistors are in an approximate range of 110 A to 160 A, and the select transistor is configured to operate in a voltage range of 4.5 V to 12 V for program or erase operations of the NVM transistor.

11. A method of fabricating a memory device, comprising:

forming a two-transistor (2T) memory cell in a memory region of a substrate, further comprising:

forming a high voltage (HV) gate oxide layer in the memory region and a logic region of the substrate;

forming a first opening in the memory region; and forming a non-volatile (NV) dielectric stack in the first opening and a select gate oxide stack outside the first opening;

forming a HV gate oxide stack, an input/output (I/O) gate oxide stack, and a low voltage (LV) gate oxide stack in the logic region, wherein the select gate oxide stack and the HV gate oxide stack have a same thickness;

depositing a high dielectric constant (high-K) dielectric layer and a dummy polysilicon gate layer in the memory and logic regions;

etching down a portion of the dummy polysilicon gate layer in the memory region;

patterning the dummy polysilicon gate and high-K dielectric layers;

patterning the NV gate dielectric stack and the select gate oxide stack to form a non-volatile memory (NVM) transistor and a select transistor respectively in the memory region;

patterning the HV, I/O, and LV gate oxide stacks to form HV, I/O, and LV transistors respectively; and replacing the dummy polysilicon gate layers respectively in the NVM, select, HV, I/O, and LV transistors with multi-level metal gate layers.

12. The method of claim 11, wherein the 2T memory cell, the HV, I/O, and LV transistors are formed within one single semiconductor die.

13. The method of claim 11, wherein the select gate oxide and HV gate oxide stacks are formed concurrently and thicker than the I/O gate oxide stack, and the I/O gate oxide stack is formed thicker than the LV gate oxide stack.

14. The method of claim 11, further comprising:

forming a patterned mask exposing the dummy polysilicon gate layer overlying the NV gate dielectric stack; and performing a polysilicon etch process to thin down the dummy polysilicon gate layer above the NV gate dielectric stack such that top surfaces of the dummy polysilicon gate layer above the NV gate dielectric and select gate oxide stacks are approximately coplanar.

15. The method of claim 11, further comprising:

forming a patterned mask such that the dummy polysilicon gate layer in the memory region and disposed above the HV gate oxide stack in the logic region is exposed; and performing a polysilicon etch process through the patterned mask to thin down the dummy polysilicon gate layer.

16. The method of claim 11, further comprising:
forming a stress inducing silicon nitride layer and an interlevel dielectric layer (ILD) in the memory and logic regions; and
performing a chemical-mechanical polishing (CMP) process until at least one of the dummy polysilicon gate layers of the NVM transistor and the select transistor in the memory region is exposed.

17. The method of claim 11, wherein replacing the dummy polysilicon gate layer further includes:
performing a polysilicon etch operation to remove the dummy polysilicon gate layer in the NVM transistor and the select transistor;
depositing a first metal gate layer overlying the high-K dielectric layer in the NVM transistor and the select transistor; and
depositing a second metal gate layer overlying the first metal gate layer.

18. The method of claim 11, wherein the NVM and select transistors are of n-channel type, and wherein:
the first metal gate layer in the NVM transistor includes low work function metal, wherein the high work function metal includes at least one of titanium, lanthanum, aluminum, and compounds or alloys thereof; and
the first metal gate layer in the select transistor includes low work function metal, wherein the low work function metal includes at least one of titanium, lanthanum, aluminum, and compounds or alloys thereof.

19. The method of claim 11, wherein:
a combined thickness of the high-K dielectric layer and the select gate oxide stack of the select transistor is in an approximate range of 110 A to 160 A, and the select transistor is configured to operate in an approximate range of 4.5 V-12 V for program/erase operations of the 2T memory cell.

20. The method of claim 14, wherein etching down a portion of the dummy polysilicon gate layer in the memory region further includes removing an approximate 90 A to 110 A of the dummy polysilicon gate layer disposed above the NV gate dielectric stack.

21. The method of claim 11, wherein the NVM, select, HV, I/O, and LV transistors have an approximately same height.

22. A method for fabricating a semiconductor device, comprising:
forming a non-volatile (NV) dielectric stack and a first gate oxide in a first region of a substrate and second and third gate oxides in a second region of the substrate;
forming a high dielectric constant (high-K) dielectric layer and a dummy polysilicon gate layer overlying the NV dielectric stack and the first, second, and third gate oxides;
etching down the dummy polysilicon gate layer overlying the NV dielectric stack;
patterning the dummy polysilicon gate and high-K dielectric layers, and respectively the NV dielectric stack and the first gate oxide to form a non-volatile memory (NVM) transistor and a select transistor in the first region; and
replacing the dummy polysilicon gate layer in the NVM and select transistors with a metal layer;
wherein the NV dielectric stack is formed subsequent to the first gate oxide; and
wherein the first, second, and third gate oxides are formed separately, the first gate oxide being thicker than the second gate oxide, and the second gate oxide being thicker than the third gate oxide.

* * * * *